United States Patent [19]
Sharma et al.

[11] Patent Number: 5,841,663
[45] Date of Patent: *Nov. 24, 1998

[54] APPARATUS AND METHOD FOR SYNTHESIZING INTEGRATED CIRCUITS USING PARAMETERIZED HDL MODULES

[75] Inventors: Balmukund Sharma, Santa Clara; Mossaddeq Mahmood, San Jose, both of Calif.; Arnold Ginetti, Antibon, France

[73] Assignee: VLSI Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 528,657

[22] Filed: Sep. 14, 1995

[51] Int. Cl.$^6$ .................................................. G06F 17/50
[52] U.S. Cl. ..................... 364/490; 364/488; 364/489; 364/491
[58] Field of Search .................................. 364/488–491, 364/578

[56] References Cited

U.S. PATENT DOCUMENTS

| | | | |
|---|---|---|---|
| 5,426,591 | 6/1995 | Ginetti et al. | 364/489 |
| 5,465,216 | 11/1995 | Rotem et al. | 364/488 |
| 5,487,018 | 1/1996 | Loos et al. | 364/489 |
| 5,491,640 | 2/1996 | Sharma et al. | 364/488 |
| 5,519,627 | 5/1996 | Mahmood et al. | 364/488 |
| 5,519,629 | 5/1996 | Mahmood et al. | 364/488 |
| 5,555,201 | 9/1996 | Dangelo et al. | 364/489 |

OTHER PUBLICATIONS

Dutt et al. ("Bridging high–level synthesis to RTL technology libraries", Proceedings–Design Automation Conference Proceedings of the 28th ACM/IEEE Design Automation Conference, Jun. 17, 1991, pp. 526–529).

Kim ("Parameter–driven data path VHDL model generation for ASIC design", IEEE, Proceedings of Sixth Annual IEEE International ASIC Conference and Exhibit, 27 Sep. 1993, pp. 270–273).

Kim ("Automatic behavioral Verilog model generation using engineering parameters", IEEE Comput. Soc. Press, Proceedings of the 1994 International Verilog HDL Conference, 14 Mar. 1994, pp. 108–114).

Preis et al. ("A reuse scenario for the VHDL–based hardware design flow", IEEE Comput. Soc. Press, Proceedings EURO–DAC '95: European Design Automation Conference with EURO–VHDL, 18 Sep. 1995, pp 464–469).

Dutt ("LEGEND: a language for generic component library description", IEEE Comput. Soc. Press, 1990 International Conference on Computer Languages, 12 Mar. 1990, pp. 198–207).

Smith et al. ("Flexible module generation in the FACE design environment", IEEE Comput. Soc. Press, IEEE International Conference on Computer–Aided Design, 7 Nov. 1988, pp. 396–399).

Claesen et al. ("Guided synthesis and formal verification techniques for parameterized hardware modules", IEEE Comput. Soc. Press, 11 Apr. 1988, pp. 90–99).

(List continued on next page.)

*Primary Examiner*—Kevin J. Teska
*Assistant Examiner*—Phallaka Kik
*Attorney, Agent, or Firm*—Flehr Hohbach Test Albritton & Herbert LLP; William S. Galliani

[57] ABSTRACT

A method and apparatus for designing circuits uses parameterized Hardware Description Language (HDL) modules stored in a library. A datapath synthesizer accesses the library and assigns values to parameters to form specific implementations of the parameterized HDL modules. The specific implementations of the parameterized HDL modules are used by the datapath synthesizer to implement an HDL circuit description. Each parameterized HDL module includes an entity description, a behavioral description, and an implementation description

19 Claims, 12 Drawing Sheets

OTHER PUBLICATIONS

Katsadas et al. ("Regular module generation or stnadard cells: two alternative implementations of a library of functional building blocks", IFIP Transactions A (Computer Science and Technology), Jan. 1, 1993, pp. 167–181).

Kission et al. ("High level specification in electronic design", IEEE, ISIE '95 Proceedings of the IEEE International Symposium on Industrial Electronics, 10 Jul. 1995, vol. 1, pp. 21–26).

Asdjodi ("ELL: Extendable Library Language", IEEE Comput. Soc. Press, Proceedings of the Twenty–Third Annual Hawaii International Conference on System Sciences, vol. 2, 2 Jan. 1990, pp. 257–266).

Tsareff et al. ("An expert system approach to paramterized module synthesis", IEEE Circuits and Devices Magazine, vol. 4, No. 1, Jan. 1988, pp. 28–36).

Girczyc et al. ("Increasing Design Quality and Engineering Productivity through Design Reuse", Proceedings of the 30th Design Automation Conference, Dallas, TX, 14 Jun. 1993, pp. 48–53).

APPARATUS AND METHOD FOR SYNTHESIZING INTEGRATED CIRCUITS USING PARAMETERIZED HDL MODULES

BRIEF DESCRIPTION OF INVENTION

The present invention relates generally to the Computer Aided Design (CAD) of complex Application Specific Integrated Circuits (ASICs). More particularly, this invention relates to a technique of synthesizing integrated circuits using a structured cell library with parameterized Hardware Description Language (HDL) modules.

BACKGROUND OF THE INVENTION

Complex ASICs are designed using a variety of CAD tools. One such tool is an HDL circuit simulator for circuits represented by a list of statements in a Hardware Description Language (HDL), such as Verilog or VHDL. The HDL circuit simulator is used to simulate and debug a specified data processing circuit. Typically, the HDL description of the circuit is simulated and revised until the circuit designer is satisfied that the specified circuit will work properly.

The object of the present invention is to provide an ASIC synthesizer that synthesizes a circuit netlist from an HDL circuit description using a library of datapath circuit elements (i.e., circuit elements with formal HDL circuit descriptions) and a library of gate elements. A netlist comprises a list of circuit components and the interconnections between those components. Once a netlist has been generated, there are a number of commercially available "silicon compilers", sometimes called "datapath compilers" or "place and route tools," that may then be used to convert the netlist into a semiconductor circuit layout, using a layout cell library of defined circuit elements, or to convert the netlist into a set of interconnections in a gate array. Other CAD tools (such as the COMPASS QTV, sold by COMPASS Design Automation, Inc., San Jose, Calif.) may then be used to verify that the resulting circuit layout will, in fact, meet timing requirements or other constraints for the specified circuit.

A primary problem with prior art datapath synthesizers is that the description of the datapath library of elements used to match HDL statements in the HDL circuit description have heretofore been ad hoc in nature. It would be highly desirable to provide a datapath library of elements that does not rely upon ad hoc design techniques. More particularly, it would be highly desirable to provide a datapath library of elements described in HDL because the elements of such a library could be simulated, verified, and synthesized using widely available HDL simulation, HDL verification, and HDL synthesis tools.

Another problem with prior art datapath synthesizers is that the components available in the datapath library are fixed. Thus, custom components cannot be formed and the datapath synthesizer is constrained to work with the components available in the datapath library. It would be highly desirable to provide datapath libraries which support the creation of customized components. In such a system, the datapath synthesizer would have more flexibility in selecting and implementing circuit designs.

SUMMARY OF THE INVENTION

The invention is a method and apparatus for designing integrated circuits through the use of parameterized HDL modules. Each parameterized HDL module includes an entity description, a behavioral description, and an implementation description. The entity description specifies the parameters, input ports and output ports for a circuit element available in the HDL library. For example, a parameter can correspond to the bit width of the library circuit element when compiling an instance of the library circuit element. Thus, parameterization allows a library circuit element to be implemented in a variety of bit widths and used in synthesized netlists for Application Specific Integrated Circuit (ASIC) designs. The behavioral description of the parameterized HDL module specifies the logical function performed by the library circuit element. The implementation description of the parameterized HDL module specifies how to construct a circuit element based on the parameter values.

A parameterized HDL library module is composed of one or more parameterized HDL modules. A datapath synthesizer accesses one or more such parameterized HDL library modules to identify parameterized HDL modules that can be used to implement an integrated circuit specified (or described) in an HDL language. When a parameterized HDL module is identified for use, parameter values are assigned to form an instance of the parameterized HDL module. This instance of the parameterized HDL module is then compiled into a netlist. The datapath synthesizer combines the compiled netlist with other netlists to form a top-level netlist. The top-level netlist is subsequently processed to form a synthesized netlist.

The invention's use of parameterized HDL modules is advantageous because it allows one to describe the circuit elements in a library in an HDL language. Thus, the HDL circuit descriptions can be simulated, verified and synthesized. Also, the parameterization allows one to specify a circuit element in a more general form, and compile different netlist implementations based on the parameter values. Standard HDL languages are known to library circuit element designers and circuit designers. Thus, a library designer or a circuit designer can easily and effectively create customized library circuit elements using any text editor tool. These customized library circuit elements described as parameterized HDL modules can then be put in a parameterized HDL library module. Subsequently, the datapath synthesizer can use compiled instances of these customized library circuit elements when synthesizing an integrated circuit from its HDL description. The entity description, behavioral description, and implementation description associated with the parameterized HDL modules can be used to specify any type of circuit element. Thus, parameterized HDL modules can be combined to form user defined HDL library modules, HDL commercial datapath library modules, and HDL ASIC Synthesizer pre-defined library modules.

BRIEF DESCRIPTION OF THE DRAWINGS

For a better understanding of the nature and objects of the invention, reference should be had to the following detailed description taken in conjunction with the accompanying drawings, in which.

Like reference numerals refer to corresponding parts throughout the several views of the drawings.

DETAILED DESCRIPTION OF THE INVENTION

Figure 1:
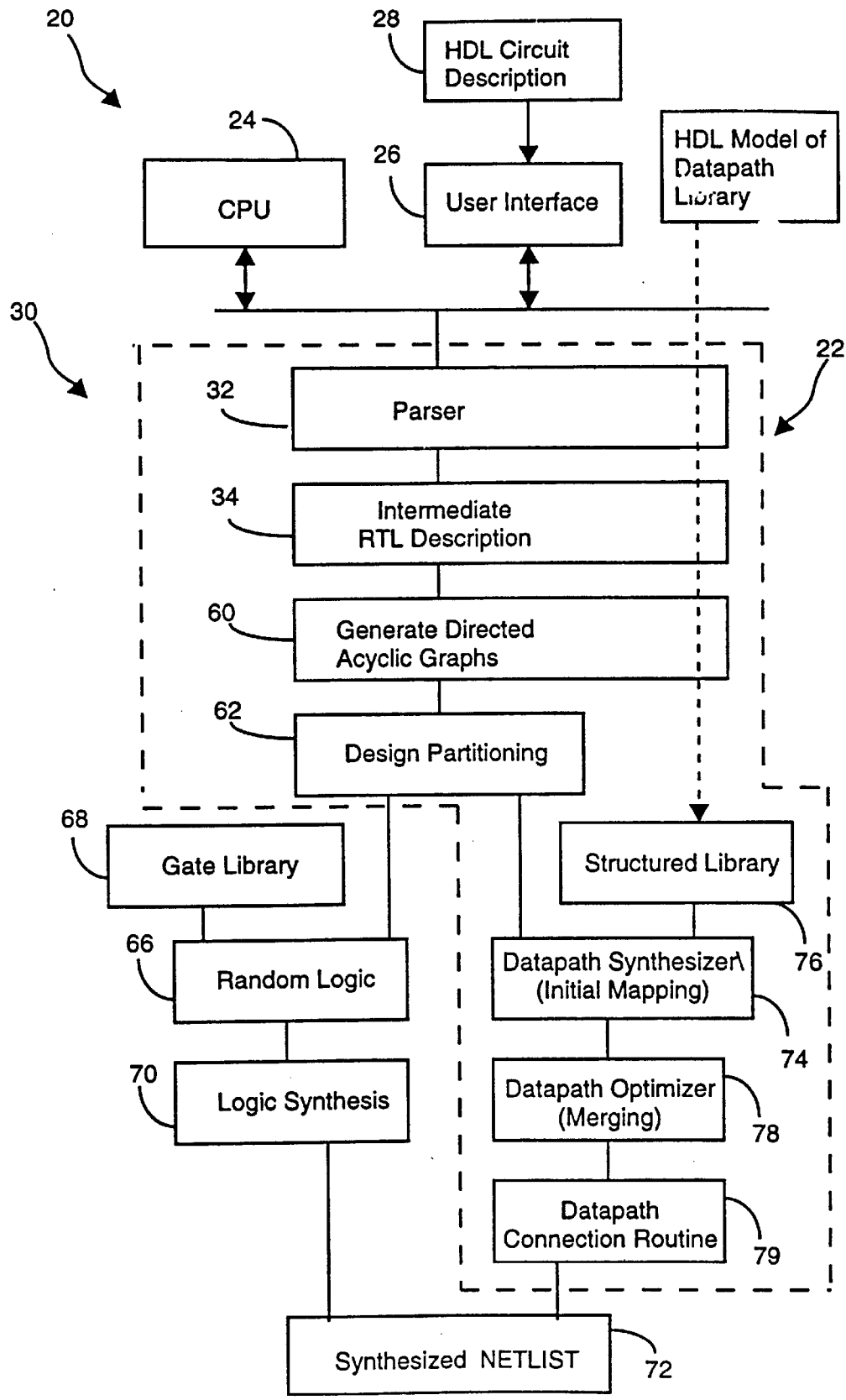
FIG. 1 is an ASIC synthesizer incorporating the datapath synthesizer of the present invention.

FIG. 1 depicts an ASIC synthesizer 20 that incorporates the datapath synthesis elements 22 of the present invention. The ASIC synthesizer 20 includes a general purpose CPU 24 that is coupled to a user interface 26. The user interface 26 is suitable for receiving a hardware description of a test circuit 28 and for conveying a synthesized netlist to a user. Thus, the user interface 26 may comprise a keyboard and computer monitor, or any other suitable combination of computer peripheral devices. The CPU 24 operates in conjunction with data and instructions stored in memory 30, which may be any combination of RAM, ROM, or disc storage.

The software stored in memory 30 includes a parser 32 that translates the HDL (hardware description language) circuit description 28 into an intermediate Register Transfer Level (RTL) structure 34 corresponding to the circuit. The hardware description language used for the circuit description 28 is preferably in the form of a commercially available language such as Verilog or VHDL. Verilog is a commercial product sold by Cadence Design Systems, Inc., San Jose, Calif.; VHDL is an IEEE standard HDL which is known in the art. By way of example, the VHDL description of the two gates of FIG. 2 would be as follows:

```
entity vdp50ai004 is
    port(A1, A2, B: IN std_logic_vector(3 downto 0);
         ZN: OUT std_logic_vector(3 downto 0);
end vdp50ai004;
architecture vdp50ai004 of vdp50ai004 is
    begin
      process(A1, A2, B) begin
        ZN <= (A1 or A2) nand B;
      end process;
end vdp50ai004;
```

Figure 2:
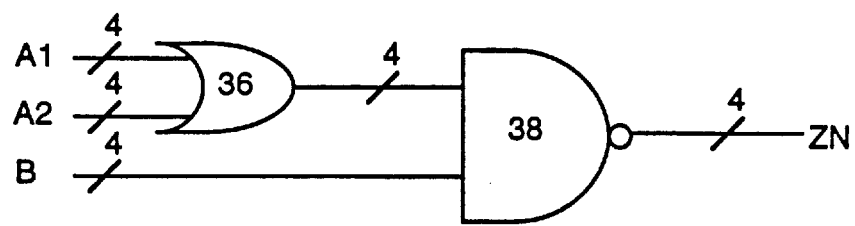
FIG. 2 depicts a multiple input, single output hardware structure that may be modeled in a hardware description language.

As depicted in FIG. 2, input signals A1 and A2 are conveyed to an OR gate 36. The output of OR gate 36 and input signal B are conveyed to NAND gate 38, yielding output ZN. The logical expression "ZN <=(A1 or A2) nand B"

reflects the functionality of the coupled OR gate 36 and NAND gate 38. The remaining code in the above VHDL circuit description complies with the formalities of the VHDL language. First, an "entity" is described, in this case, the hardware components of FIG. 2 are identified as "vdp50ai004". The "port" field lists all the external ports associated with a hardware element. In the example provided, A1, A2, and B are identified as 4 bit vector input ports, while ZN is identified as a 4-bit vector output port.

More complicated hardware components that are not standard items in a given library may also be modeled in a language such as HDL. For instance, the components of FIG. 3, may also be modeled in HDL. The hardware components of FIG. 3 receive an input "a" and "b" signal, and depending upon the select ("sel") signal, either add or subtract these values. The output "sig1" is conveyed to an instance of a D-type flip-flop ("Inst1 of DFF") and generate an output "Outp1" signal. Simultaneously, input "c" and "d" signals are subjected to a XOR operation to generate an output "Outp2" signal. A VHDL description of these components is:

```
entity addsubff is
    port (sel : in bit;
          a,b,c,d : in bit_vector(7 downto 0);
          clk,rst : in bit;
          outp1,outp2 : out bit_vector( 7 downto 0)
          );
end addsubff;
architecture addsubff of addsubff is
signal sig1 : bit_vector(7 downto 0);
begin
    inst1:dff port map(d => sig1,q => outp1,clk => clk,rst => rst);

outp2 <= c xor d;
    process(sel,a,b)
        begin
            if sel = '1' then
                sig1 <= a + b;
            else
                sig1 <= a - b;
            end if;
        end process;
end addsubff;
```

Figure 3:
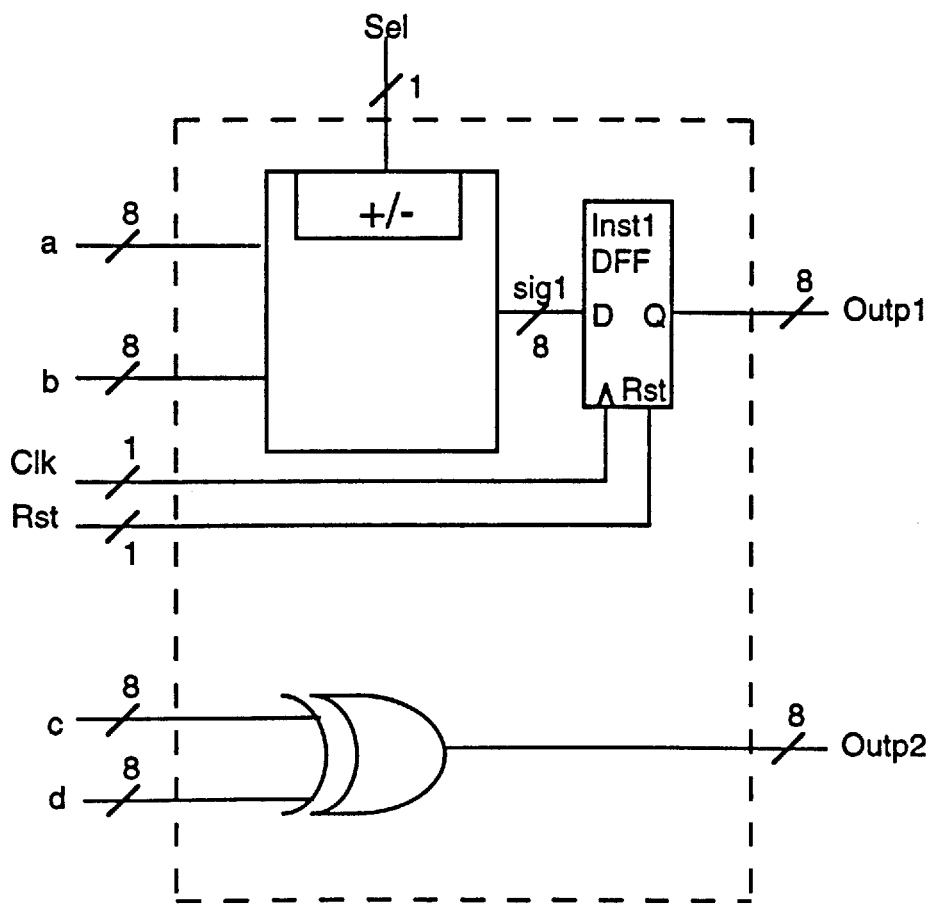
FIG. 3 depicts a multiple input, multiple output hardware structure that may be modeled in a hardware description language.

The components of FIG. 3 are identified in the above HDL code as an entity "addsubff". The "port" field lists all the external ports declared in the entity. These include the input ports (a,b,c,d) that are defined as 8 bit vector values, a select bit (sel) for selecting the add or subtract operation, a clock (clk) and reset (rst) bit, and two output ports (outp1, outp2) that are defined as 8 bit vector values. The "signal" field lists the internal signals described in the architecture. In this case, "sig1", an 8 bit vector value.

The "inst" field lists instances of predefined circuit structures, such as flip-flops, to be used in the described circuit. In this example, "inst1" is an instance of a defined circuit component called "dff". The port map associated with this component specifies that the internal signal "sig1" is connected to port "d" of component "dff", while output signal "outp1" is connected to output port "q" of component "dff", and so forth.

It should be noted that the HDL description of the component "addsubff" includes a number of logical expressions: A+B, A−B, C XOR D, sel='1', and "IF". The significance of the identification of these logical and mathematical expressions will be described below.

In accordance with the invention, the HDL description of each component of the circuit is transformed by the Parser 32 into an intermediate Register Transfer Level (RTL) structure corresponding to the component. This intermediate data structure defines important attributes of the corresponding hardware element.

Figure 4:
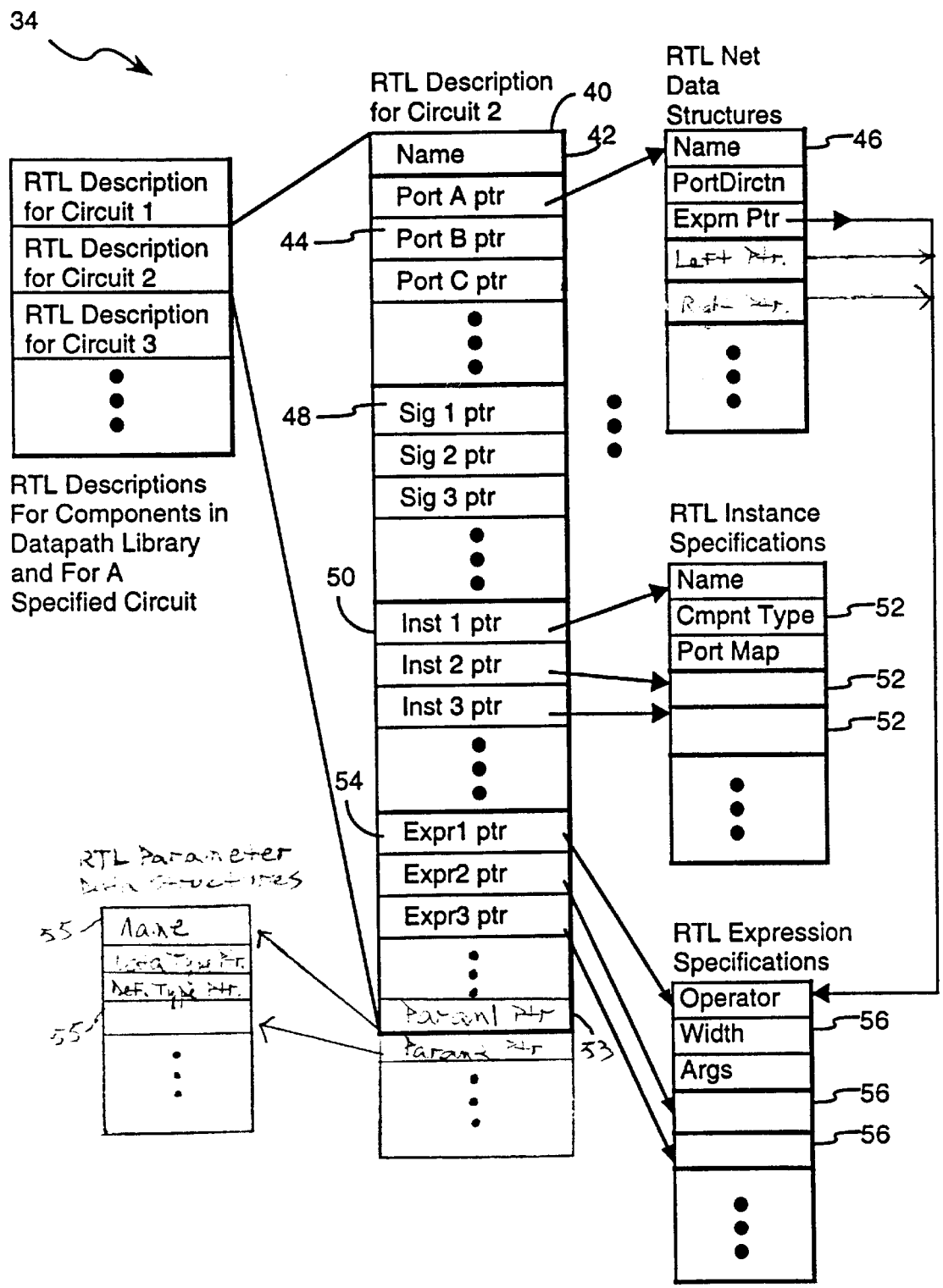
FIG. 4 is a block diagram of the intermediate RTL structure of a circuit and its relation to datapath library elements.

Referring to FIG. 4, the RTL data structure 34 for representing both the circuit to be synthesized, as well as for representing the circuits in the structured library of defined components, is defined as follows. For each defined circuit component, one record 40 (of type RTL) is created having the following fields:

```
class RTL is (
    string name;
    pointer (List) ports;
    pointer (List) sigs;
    pointer (List) insts;
    pointer (List) exprs;
    pointer(List) params;
);
```

The name field 42 in the RTL record (data structure) is a string of characters representing the name of a circuit components, such as "addsubff" for the circuit described above with respect to FIG. 3. The "ports" field 44 in the RTL data structure is a list of pointers to RTL Net data structures 46 representing the circuit's input and output ports. Similarly, the "sigs" field 48 in the RTL record is a list of pointers to RTL Net data structures 46 representing internal nodes in the circuit. The "insts" field 50 is a list of pointers to RTL Instance specification records 52, each of which defines one instance of a library circuit component. The "exprs" field 54 is a list of pointers to RTL Expression specification records 56, each of which defines one logical or mathematical expression. Finally, the "params" field 53 is a list of pointers to RTL Parameter Data Structures 55, which are used to specify parameters for cell structures, as will be discussed below.

The RTL Net record (data structure) 46 used to represent each port and internal node has the following data structure:

```
class rtlNetClass (
    string netName;
    bits portDirection;
    pointer (rtlExprClass) expr;
    pointer (rtlExprClass) left;
    pointer (rtlExprClass) right);
``` where the "netName" field is the name of a port or node (such as "a", "Clk", or "Outp1" for the circuit of FIG. 3), the "portDirection" field is a bit vector value that identifies a port, for instance as an input or output port, and the "expr" field is a pointer to an RTL Expression specification record 56 for a value of an output port or an internal node, in this example, "Outp1", "Outp2", and "sig1". The field "left" is a pointer to an RTL Expression specification record denoting the left bound of a net (such as "7" for net "a"), and the field "right" is a pointer to an RTL Expression specification record denoting the right bound of a net (such as "0" for net "a").

The HDL port description for the circuit of FIG. 4 is defined as follows:

```
port (sel: in bit;
      a,b,c,d: in bit_vector(7 downto 0);
      clk, rst: in bit;
      outp1, outp2: out bit_vector (7 downto 0));
```

The corresponding RTL description would include a separate RTL Net record 46 for each of the ports listed in the HDL description.

The RTL Instance Specification record (data structure) 52 includes fields indicating the instance name (an example of which is "inst1"), the component type (such as DFF) of which this is an instance, and a port map (an example of which is "d=>sig1, q=>outp1, clk=>clk, rst=>rst") that indicates the nodes to which the component instance is connected. The RTL Parameter record (data structure) 55 includes fields indicating the parameter name, data type of the parameter (for example, integer or boolean type) and the default value for the parameter. The structure of RTL Parameter record 55 is defined as:

```
Class rtlParamClass (
    string name;
    pointer (dataTypeClass) dataType;
    Pointer (valueClass) defValue);
```

The "name" field is the name of a parameter, the "dataType" field denotes its data type, and the "defvalue" field is the default value of the parameter.

For example, the following entity description:

```
Entity MY_ASB is
    generic (N: INTERGER :=4);
    port (A, B: IN std_logic_vector (N-1 downto 0);
    C_IN: IN std_logic;
    ADD_SUB: IN std_logic;
    RES: OUT std_logic_vector (N-1 downto 0));
end MY_ASB;
``` has one parameter (or generic using VHDL terminology) called "N", whose data type is "INTEGER", and the default value is the integer value "4". This can be represented using the structure of 55 as:

```
class rtlParamClass (
    name: N
    dataType: INTEGER data type
    defValue: integer value 4
);
```

The RTL Expression specification record (data structure) 56 is used to define logical and mathematical expressions such as A+B, A−B, C XOR D, sel='1', and "IF". Each expression is defined by an operator, signal width, and list of arguments (i.e., signals or nodes). The structure of record 56 is defined as:

```
class rtlExprClass (
    integer operator;
    integer width;
    pointer (list) arguments);
```

Expressions can have other expression as inputs forming an expression tree called a Directed Acyclic Graph (DAG). In the prior art, DAGs are derived from the HDL description of an element. In accordance with the present invention, DAGs are generated from the RTL description of an element (block 60 in FIG. 1).

Figure 5:
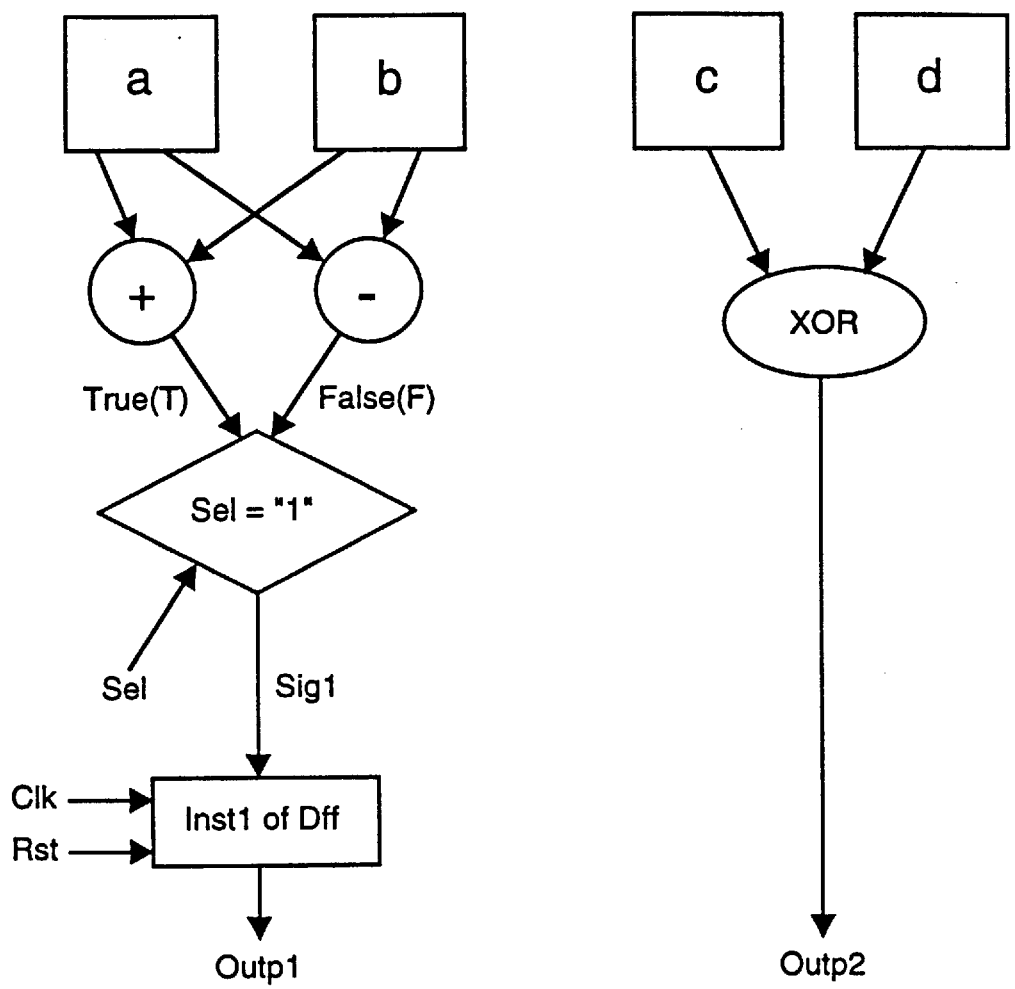
FIG. 5 depicts a Directed Acyclic Graph corresponding to the hardware structure of FIG. 3.

FIG. 5 depicts the DAGs corresponding to the "addsubff" structure of FIG. 3. Expression trees are formed by creating expressions from input ports and intermediate signals. In this example, signals are provided by input ports "a", "b", "c", and "d", and by intermediate signal "sig1". Operations are performed by expressions such as "+", "−", or "XOR". Note that the value of "Outp1" is the same as the output port Q of instance "inst1" of component "dff" in the above HDL circuit description.

Figure 6:
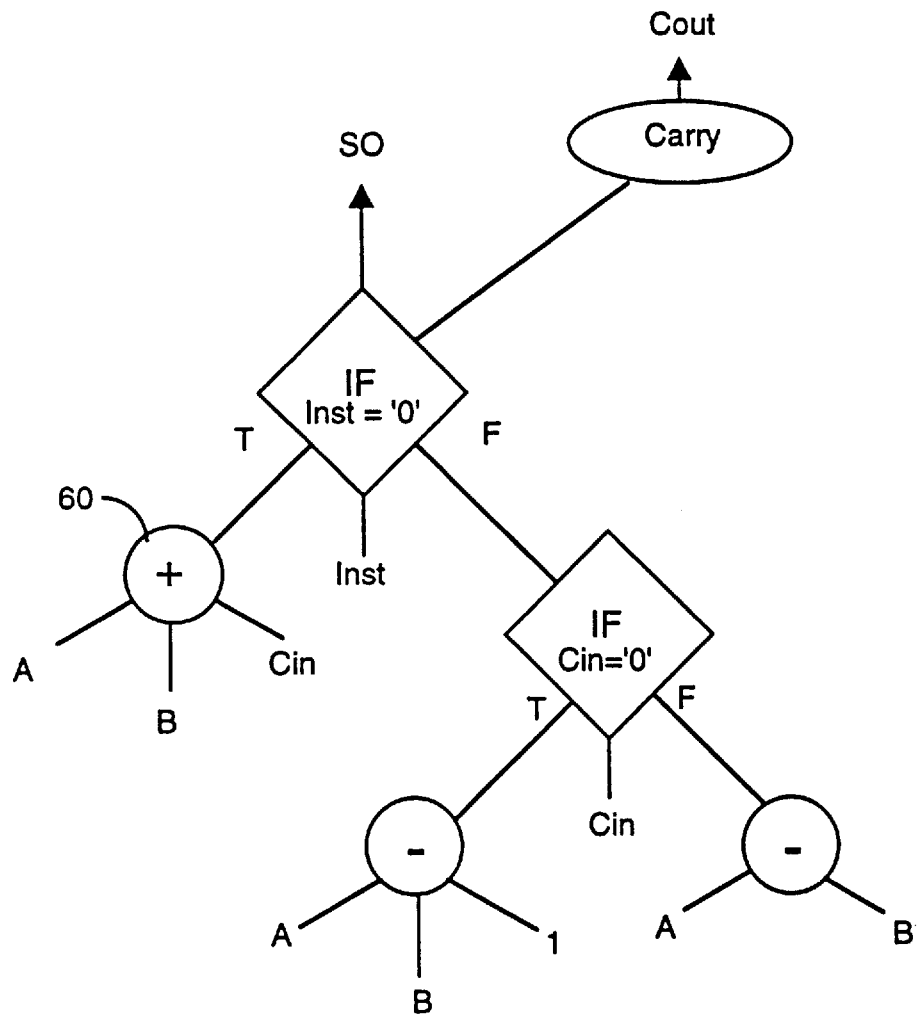
FIG. 6 depicts a Directed Acyclic Graph corresponding to an addition/subtraction unit.

FIG. 6 shows another example of a DAG for an addition/subtraction unit that is described in HDL as follows:

```
entity vdp1asb001 is
    port (A, B: IN std-logic-vector (3 downto 0);
          SO, STATUS: OUT std-logic-vector (3 downto 0);
          CIN: In std-logic
          INST: IN std-logic;
          COUT: OUT std-logic);
end vdp1asb001;
architecture vdp1asb001 of vdp1asb001 is
    begin
        process(A, B, CIN, INST) begin
            if INST = '0' then
                SO <= A + B + CIN
                COUT <= CARRY(A + B + CIN);
            else if CIN = '0' then
                SO <= A - B - '1';
                COUT <= CARRY(A - B - '1');
            else
                SO <= A - B
                COUT <= CARRY(A - B);
            end if;
            end if;
        end process;
    end vdp1asb001;
```

Using the RTL definitions previously discussed, it will be recognized that a number of RTL expressions are present in this HDL code. Namely, there are two "if" expressions, two minus ("−") expressions, and two plus ("+") expressions. In addition, there are a number of operands, or input values, including: A, B, CIN, and INST. The expressions take the operands and yield two outputs: SO (SumOut) and COUT (CarryOut). This information may be transformed into the DAG depicted in FIG. 6.

Returning to FIG. 1, after the Directed Acyclic Graphs are generated (block 60), the present invention employs the step of Design Partitioning (block 62). Given a design description that is converted to an RTL Description (block 34), with each output having a value that is described as a DAG (block 60), the design is partitioned (block 62). Two types of partitioning are employed. First, random logic is partitioned from datapaths. Next, datapaths are partitioned based upon their signal widths. That is, expressions with the same width are grouped into a single datapath. Using the examples of FIGS. 3 and 5, "a+b", "a−b", "C XOR D", and the "IF"statement can be efficiently implemented in an 8 bit datapath. For instance, "a+b" and "a−b" can be implemented using datapath adders/subtractors, "C XOR D" can be implemented using an 8 bit datapath XOR gate.

In the prior art, irregular data paths are compiled, wasting area. The present invention reduces layout area by partitioning the datapath into several smaller datapaths based on the width of the expression.

Those elements of the specified circuit that must be implemented using random logic are partitioned from the datapath elements, resulting in a listing of boolean expressions representing the random logic elements 66, each of which is mapped to one or more circuit elements in a logic gate library 68. For example, the one bit expression "sel='1'" may be implemented using simple random logic gates. The random logic elements 66 are mapped into logic gates by the logic synthesizer 70, thereby producing the logic gate portion of the synthesized netlist 72 for the specified circuit. Logic synthesis is well known to those skilled in the art, and logic synthesizer 70 is implemented using commercially available logic synthesizer software, such as the COMPASS ASIC Synthesizer from COMPASS Design Automation, Inc., San Jose, Calif.

The datapath portion of the synthesized netlist 72 is generated by a datapath synthesizer 74 that utilizes structured library 76. It should be noted that the contents of the structured library 76 are generated by performing the same sequence of parsing and graphing steps 32, 34, 60 as described above, except as applied to an HDL model for all the circuit elements to be included in the library 76. This will be discussed in more detail below with regard to FIGS. 7 and 8.

The datapath structure 142 generated by the datapath synthesizer 74 is further processed by the datapath optimizer 78 to produce an optimized set of library cells for implementing the specified circuit. The resulting set of cells is then processed by a datapath connection routine so as to generate the lists of cell interconnections required to produce synthesized net list 72. Attention will now turn to the datapath synthesizer 74, structured library 76, and data path optimizer 78 of the present invention.

Figure 7:
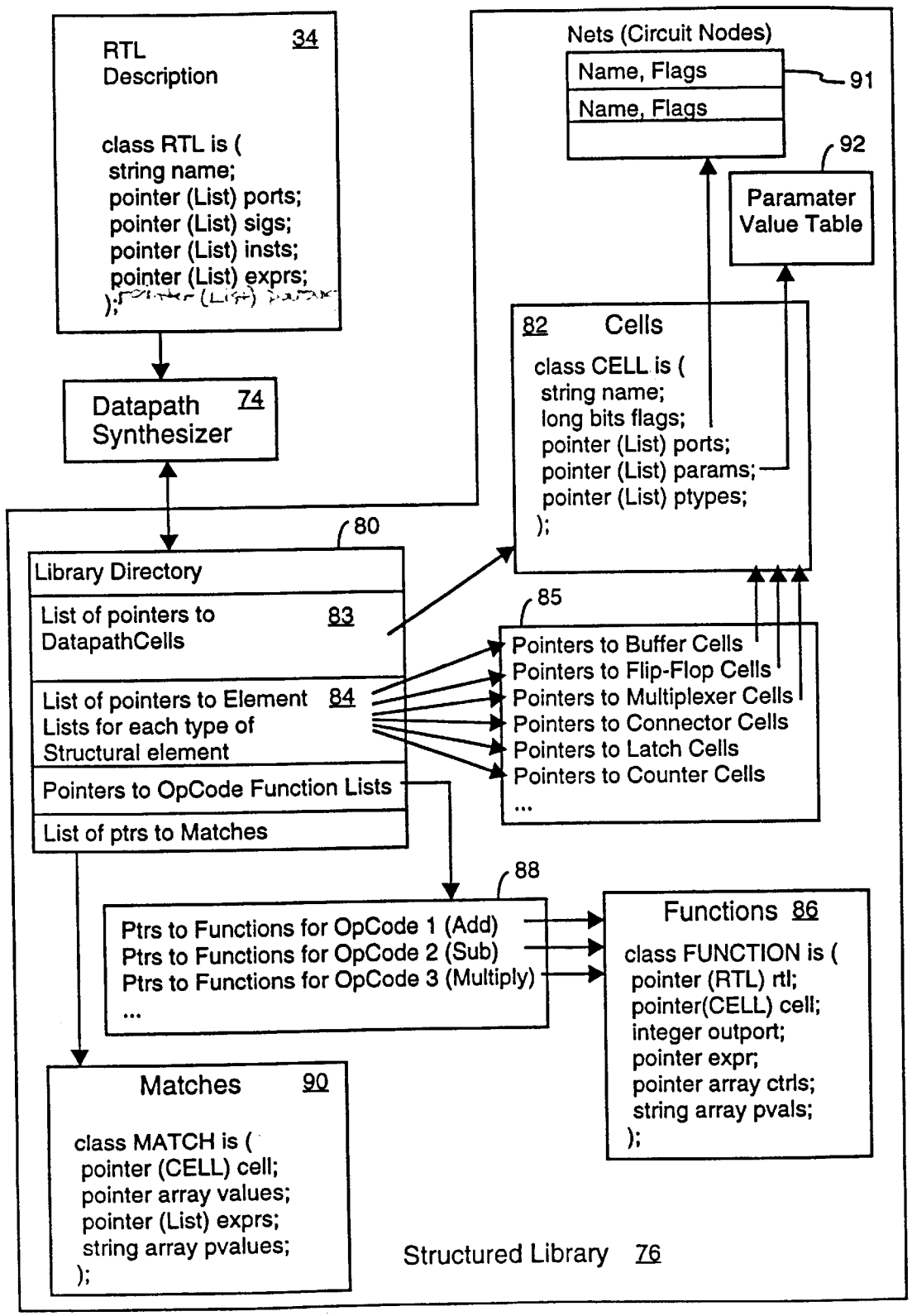
FIG. 7 depicts the data structure used in the structured library of the preferred embodiment.

As shown in FIG. 7, the structured library 76, utilized by the datapath synthesizer 74 during circuit synthesis, has a library directory 80, Cell data structures 82, Function data structures 86, and Match data structures 90. The present invention uses a structured format to accommodate a variety of library elements. The structured library format of the present invention is defined as follows:

```
class NET (
    string           name;
    long bits        flags;
    );
class CELL (
    string           name;
    long bits        flags;
    pointer (List)   ports;
    pointer (List)   params;
    pointer (List)   ptypes;
    );
class FUNCTION (
    pointer (RTL)    rtl;
    pointer (CELL)   cell;
    integer          outPort;
    pointer          expr;
    pointer array    ctrls;
    string array     pvals;
    );
class MATCH (
    pointer (CELL)   cell;
    pointer array    values;
    pointer (List)   exprs;
    string array     pvals;
    );
```

The "NET" structure 91 stores a "name" of a port of a circuit element. The "NET" structure also stores "flags" which describe properties associated with the port, such as input or output, data or control, and width of a port.

The "CELL" structure 82 specifies the components and properties of a datapath cell. The "name" field identifies the datapath cell. The "flags" field contains a set of bit flags used to specify properties of each cell. For instance, one flag may be defined to indicate that the cell's outputs are inverted, another indicating the ability to have tri-stated outputs, and so on. The "params" field lists (through a set of pointers) the names of parameters, if any, used by the cell. The "ptypes" field contains a corresponding list of the types of the parameters in the "params" field.

The library directory 80 contains a first list 83 of cell pointers for datapath elements that perform computations. The library directory 80 also contains a second list 84 of pointers to cells lists 85 for structural components (i.e., datapath elements used for data storage, buffering, interconnects, etc.). Thus there will be one pointer in 84 for buffer cells, one for flip-flop cells, etc. Each list in 85 contains the pointers to all the cells of the corresponding type.

The "FUNCTION" structure 86 stores information defining how a datapath library element performs an operation. The "rt1" field points to the RTL structure of a datapath library element (such as vdp1asb001). Similarly, the "cell" field points to the CELL structure for the same datapath library element. The "expr" field stores the RTL expression (say A+B) that is computed by this datapath element (that is, vdp1asb001) at port position "outPort". The "ctrls" field stores the values of the control signals for the list of ports in the "ports" field of the CELL structure which is required to compute operation "expr" by this datapath element. Similarly, the "pvals" field stores the values of the boolean parameters corresponding to the list of parameters in the "params" field of the CELL structure which is required to compute operation "expr" by this datapath element. When the operation does not require control signals and boolean parameter values (such as AND, XOR, and OR gates), the "ctrls" and "params" fields have empty or null values. The "expr" field of each FUNCTION record is the tree-pattern used by the Operation Mapper, to be described below, for determining the port mapping values.

The "MATCH" structure 90 stores values indicating which cell structures can be used to perform a given function. In other words, the "MATCH" structure stores information indicating which elements within the library can perform a given function such as "A+B". The "cell" field in the match structure is a pointer to the datapath element in the library that can perform the given function. The "values" field stores the port mapping values that are required to perform this function. The "pvalues" field stores the parameter values that are required to perform this function. As will be more fully described below, the MATCH structure is dynamically created by the Operation Mapper and Instance Mapper, and is used by the Datapath Synthesizer for synthesizing the resultant datapath structure.

Other data structures in the library 76 include Nets 91 and Parameter Values 92. There is one Net data structure 91 for describing every port of every cell, and one Parameter value data structure 92 for each cell. Some cells perform somewhat different functions depending on parameter values assigned to the cell, and the parameter values in structure 92 indicate defined parameter values for each cell. For many cells, the parameter list is empty. The Net 91 data structure provides the port's name, and a set of bit flags that specify the port's type (input, output, control, etc.) and the port's path width. An example of the schema for the bit flags is as follows:

| Bit # | Description |
|---|---|
| 0 | =1 for input port |
| 1 | =1 for output port |
| 2 | =1 for control signal |
| 3 | =1 for inverted signal |
| 4 | =1 for tristate |
| ... | ... |
| 8–15 | Binary value of port width. |

The following is a listing of an example of the data structures found in the structured library format as applied to the add/subtract unit defined above in relation to FIG. 6:

```
class CELL (
    name: VDP1ASB001
    ports: (A, B, SO, Status, CIN, INST, COUT)
    params: (empty-list)
    ptypes: (empty-list)
);
class FUNCTION (
    cell: VDP1ASB001 cell
    outPort: 3
    expr: A + B + CIN
    ctrls: (nil, nil, nil, nil, nil, 0, nil)
    pvals: (empty-list)
);
class FUNCTION (
    cell: VDP1ASB001 cell
    outPort: 3
    expr: A + B
    ctrls: (nil, nil, nil, nil, 0, 0, nil)
    pvals: (empty-list)
);
class FUNCTION (
    cell: VDP1ASB001 cell
    outPort: 3
    expr: A + B + 1
    ctrls: (nil, nil, nil, nil, 1, 0, nil)
    pvals: (empty-list)
);
class FUNCTION (
    cell: VDP1ASB001 cell
    outPort: 3
    expr: A - B - 1
    ctrls: (nil, nil, nil, nil, 0, 1, nil)
    pvals: (empty-list)
);
class FUNCTION (
    cell: VDP1ASB001 cell
    outport: 3
    expr: A - B
    ctrls: (nil, nil, nil, nil, 1, 1, nil)
    pvals: (empty-list)
);
class FUNCTION (
    cell: VDP1ASB001 cell
    outPort: 7
    expr: CARRY(A + B + CIN)
    ctrls: (nil, nil, nil, nil, nil, 0, nil)
    pvals: (empty-list)
);
class FUNCTION (
    cell: VDP1ASB001 cell
    outport: 7
    expr: CARRY(A + B)
    ctrls: (nil, nil, nil, nil, 0, 0, nil)
    pvals: (empty-list)
);
class FUNCTION (
    cell: VDP1ASB001 cell
    outPort: 7
    expr: CARRY(A + B + 1)
    ctrls: (nil, nil, nil, nil, 1, 0, nil)
    pvals: (empty-list)
);
class FUNCTION (
```

```
    cell: VDP1ASB001 cell
    outPort: 7
    expr: CARRY(A − B − 1)
    ctrls: (nil, nil, nil, nil, 0, 1, nil)
    pvals: (empty-list)
);
class FUNCTION (
    cell: VDP1ASB001 cell
    outPort: 7
    expr: CARRY(A − B)
    ctrls: (nil, nil, nil, nil, 1, 1, nil)
    pvals: (empty-list)
);
```

The FUNCTION structures listed above are derived from the DAG of FIG. 6 by partially evaluating the DAG with respect to control port values of "CIN" and "INST". The "ctrls" indicate the values of the control signals (e.g., "Inst" and "Cin") required by "cell" (e.g., vdp1asb001) to perform "expr" (e.g., A+B) at "outPort" (e.g., "SO").

The expressions from the "FUNCTION" structures may be placed into a function table 88 which corresponds to the datapath element "vdp1asb001". A function table for this element would be as follows:

|  | Control Signals | |
|---|---|---|
| Operation | INST | CIN |
| SO <= A + B + CIN | 0 | X |
| SO <= A + B | 0 | 0 |
| SO <= A + B + 1 | 0 | 1 |
| SO <= A − B − 1 | 1 | 0 |
| SO <= A − B | 1 | 1 |
| COUT <= CARRY(A + B + CIN) | 0 | X |
| COUT <= CARRY(A + B) | 0 | 0 |
| COUT <= CARRY(A + B + 1) | 0 | 1 |
| COUT <= CARRY(A − B − 1) | 1 | 0 |
| COUT <= CARRY(A − B) | 1 | 1 |

Figure 8:
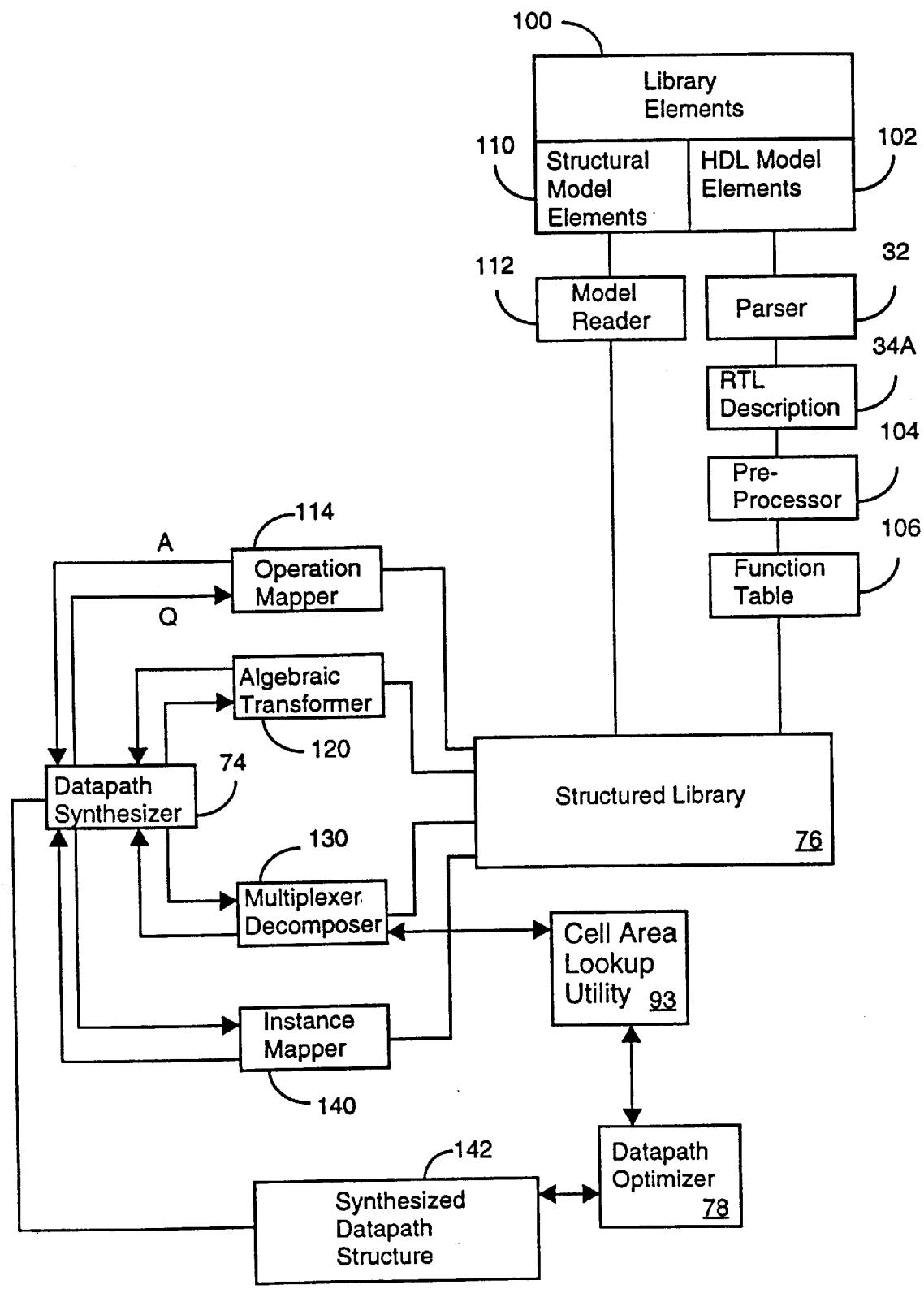
FIG. 8 is a more detailed depiction of the datapath synthesizer.

Referring to FIG. 8, the structured library 76 is loaded with a library of elements 100 that are mapped into the structured library data format. In particular, the structured library 76 receives two types of elements. The HDL model elements 102 correspond to circuit hardware elements that are defined in a hardware description language such as VHDL. These library elements are processed by Parser 32 to generate an RTL description 34A, as previously discussed in relation to FIG. 1. However, unlike the system of FIG. 1, a preprocessor 104 is employed to further map the RTL description 34A of the HDL elements into a function table 88 that contains a list of operations performed by the datapath elements 102 and their corresponding control signal values. An example of a portion of the function table 88 was provided above in relation to element "vdp1asb001".

The library elements of the invention also include structural model elements 110. A model reader 112 takes structural model elements 110 and maps them into the data structure of the structured library 76. The model elements 110 are generally simple circuit elements that are conducive to direct mapping into the library 76. The HDL description of each such element includes a cell type (such as buffer, latch, flip-flop, etc.) an alpha-numeric identification, a description of the properties of a cell, and a description of the ports of a cell. For example, consider a simple non-inverting three state buffer with a bus-controlled enable. The input signal is "I", the output signal is "Z", and the enable signal is "OE". This model element is defined in the structural model language as follows:

```
beginCell buffer VDP36SBT03
    drive 3
    speed med
    type triBusEnable
    net I din width=4 pos=0
    net Z dout width=4 tri=yes
    net OE busenable width=1 value=high
endcell
```

"Buffer" is the type of cell, while "VDP36SBT03" is the name of the cell. The cell is also identified as a sub-type with "triBusEnable". Properties of the cell include medium speed and an output drive capability of "3" (i.e., it can handle a fanout to three cell input ports). Each port is identified with a "net" characterization. For instance, "net OE" is the "busenable", which is a one bit value (width =1) that is enabled on a high input (value=high).

This element is mapped into the previously defined library data structure as follows:

```
structure CELL is (
    name: VDP3TSBT03
    flags: buffer, three-state, non-inverting
    ports: (I,OE,Z)
    params: (empty-list)
    p-types: (empty-list)
);
```

Model elements 110 are mapped to cell structures 82, while the RTL descriptions 34A of HDL elements are mapped to cell structures 82 and function structures 86. The function table 88 is a list of function structures 84, partitioned by operator type. In particular, the library directory 80 contains one "function list" pointer for each type of datapath operator, such as ADD, SUB, MULTIPLY, and so on, that points to a list 88 of functions 86. The datapath synthesizer 74 can efficiently find all function structures 84 corresponding to a specified operator, by following the directory pointer for the specified operator to the corresponding list 88 of function pointers, and then accessing only the function structures 86 for the specified operator.

As will be described below, match structures 90 are generated by the Operation Mapper 114 and Instance Mapper 140 in conjunction with the datapath synthesizer 74. In particular, the datapath synthesizer 74 compares the RTL description of a specified circuit's elements to the elements within the library 76. The match structures 90 identify library elements that can perform the operations defined by a given RTL description of a specified circuit element. From the list of matched or available structures, selections are made to optimize the resulting circuit with respect to certain circuit characteristics, such as area, speed or power consumption.

Referring again to FIG. 8, the datapath synthesizer 74 uses the structured library 76 to generate the match structures 90 as follows. An operation mapper 114 maps each behavioral operation of a specified circuit (i.e., the circuit to be synthesized) to one or more cells within the structured library 76. This mapping is performed by matching tree structures associated with the RTL description of the specified circuit's elements with tree structures associated with the elements of the structured library 76. In particular, the tree structures associated with the DAGs of the RTL description of the specified circuit are matched with the tree structures associated with the DAGs stored in the library's Function structures 86.

Figure 9:
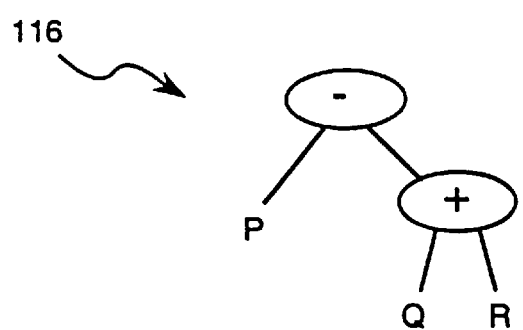
FIGS. 9 and 10 illustrate examples of matching tree-patterns associated with an element of a specified circuit and an element in a structured library.

For instance, FIG. 9 depicts a tree pattern 116 that needs to be matched with elements in the library 76. The tree pattern 116 corresponds to a DAG derived from an RTL description. For instance, FIG. 5 includes a number of branches that may be decomposed into structures analogous to tree pattern 116.

Figure 10:
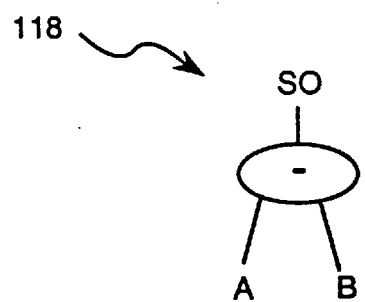

The tree pattern 116 is compared by the operation mapper 114 (FIG. 8) with elements within the structured library 76 to ascertain which elements within the structured library may be used to execute the function defined by the tree pattern 116. In particular, the datapath synthesizer 74 queries the operation mapper 114 about items within the structured library 76. The operation mapper 114 examines the elements within the structured library 76 and returns a list of library elements that may be used to execute the operation. For instance, FIG. 10 depicts a tree structure 118 for a library element that corresponds to a portion of the tree structure 116 in FIG. 9. In this example, the tree structure 118 is an RTL representation of an HDL library element VDP1ASB002. The structured library representation of this element is as follows:

```
structure CELL is (
  name: VDP1ASB002
  flags:
  ports: (A, B, SO, STATUS, INST-SA, INST-SB,
          INST-CIN, INST-COUT)
  params: (empty-list)
  ptypes: (empty-list)
);
structure MATCH is (
  cell: VDP1ASB002
  values: (P, Q + R, P - (Q + R), nil, 0, 1, 1, nil)
  exprs: (empty-list)
  pvalues: (empty-list)
);
```

The above "MATCH" structure indicates that the value "A" of the cell library element maps to the value "P" in the tree structure 116, while the value "B" of the cell library element maps to the value "Q+R" of the tree structure 116.

In the simple example provided in relation to FIG. 9, the operation mapper 114 would typically identify a large number of matches (i.e., elements in the library that can perform the function diagramed in FIG. 9) for the structure. The selection of a particular matched item will be discussed below.

Tree pattern matching is facilitated by use of a common RTL structure for both the specified circuit and the library elements, which enables the present invention to efficiently and correctly identify potential matching structures.

As shown in FIG. 8, the present invention also employs an algebraic transformer 120. The Algebraic Transformer 120 is run prior to the tree pattern matching performed by the operation mapper 114. In particular, the algebraic transformer 120 inspects the operators in every expression for the specified circuit. If an expression has an operator not matched by any of the Functions in the library 76, the algebraic transformer 120 transforms the unmatched operator structure, using a set of "algebra" rules, into an equivalent expression that has a direct mapping to structures within the library 76.

Figure 11:
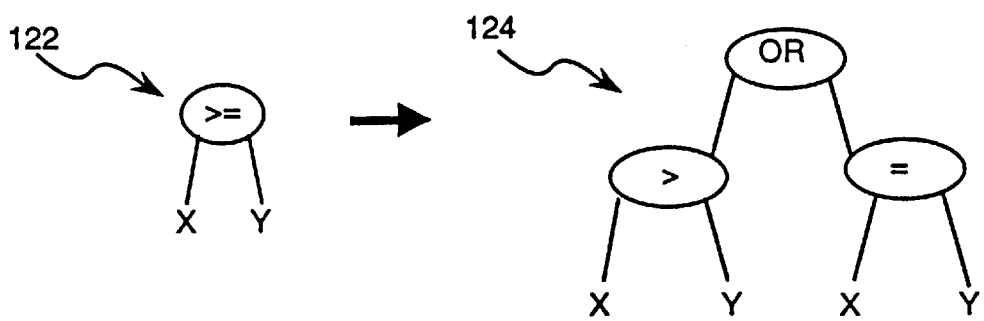
FIG. 11 illustrates an example of algebraic transformation.

FIG. 11 depicts an example of this operation. Tree structure 122 tests whether "X" is greater than or equal to "Y". If the structured library 76 does not have any elements which match this tree structure, the algebraic transformer 120 uses a predefined set of algebraic rules to generate a functionally equivalent structure 124. Tree structure 124 is functionally equivalent to tree structure 122. In this example, tree structure 124 will determine whether "X" is greater than or equal to "Y" by ascertaining if "X" is greater than "Y" or if "X" is equal to "Y".

Thus, in accordance with the invention, the algebraic transformer 120 is used to generate algebraically equivalent tree structures for unmatched RTL tree structures in a specified datapath. As will be appreciated by one skilled in the art, a variety of algebraic rules may be invoked to generate algebraically equivalent structures. These rules may be stored in the form of "IF . . . THEN . . . " clauses. For instance, "IF the structured library does not have an element that can perform operation A, AND the structured library satisfies certain conditions, THEN transform operation A into an equivalent expression." The following is a table of exemplary algebraic conversion rules:

SAMPLE ENTRIES FROM TRANSFORMER TABLE

CONVERTED FORM

| RULE | OPERATION | |
|---|---|---|
| 1 | X Not Equal To Y | NOT (REDUCE-NOR( (X XOR Y))) |
| 2 | X (unsigned) > Y | CARRY(Y−X) = 0 |
| 3 | X (signed) >= Y | CONCAT(NOT(MSB(X)), MSB-1:0(X)) >= CONCAT(NOT(MSB(Y)), MSB-1:0(Y)) |
| 4 | X >= Y | CARRY(X−Y−1) = 0 |
| 5 | X >= 1 | (X>Y) OR (X=Y) |

Returning to FIG. 8, the present invention preferably includes a multiplexer decomposer 130 that maps a large multiplexer into a tree structure of smaller multiplexers if it is spatially advantageous to do so (i.e., if it reduces the total amount of circuit area used). The layout area associated with each multiplexer cell in the library is obtained from a cell area look-up utility 93 that outputs area values, and also port width values, in response to cell type identifiers. The multiplexer decomposer 130 accesses this information to generate a minimum area tree structure of multiplexers.

Figure 12A:
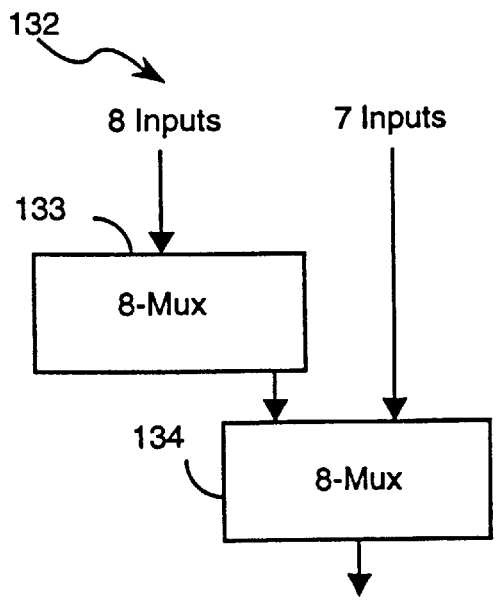
FIGS. 12A and 12B depicts two examples of cascaded multiplexers.
Figure 12B:
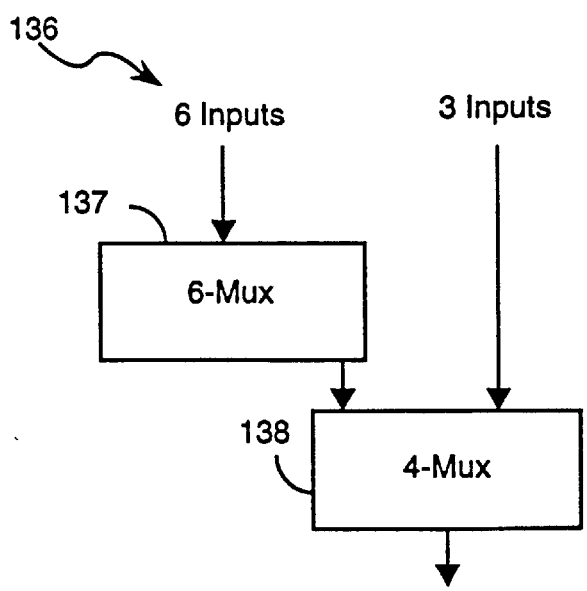

FIGS. 12A and 12B provide two examples of cascaded multiplexers can be generated by the multiplexer decomposer 130. Multiplexer structure 132 replaces a fifteen port input multiplexer with an eight input multiplexer 133 that is cascaded with another eight input multiplexer 134. Multiplexer structure 136 replaces a nine input multiplexer with a six input multiplexer 137 that is cascaded with a four input multiplexer 138.

Returning to FIG. 8, the invention preferably includes an instance mapper 140. The instance mapper 140 is employed to map RTL latches, flip-flops, and 3-state buffers with equivalent structures within the structured library 76. A match structure, as previously defined, identifies the available structures within the structured library 76.

The datapath synthesizer 74 of the present invention utilizes the structured library 76, the operation mapper 114, the algebraic transformer 120, the multiplexer decomposer 130, and the instance mapper 140 to generate a list of datapath elements and corresponding connections that can implement the operations of the test circuit. This information is stored in a synthesized datapath structure 142. The synthesized datapath structure 142 represents the derived datapath.

Figure 13:
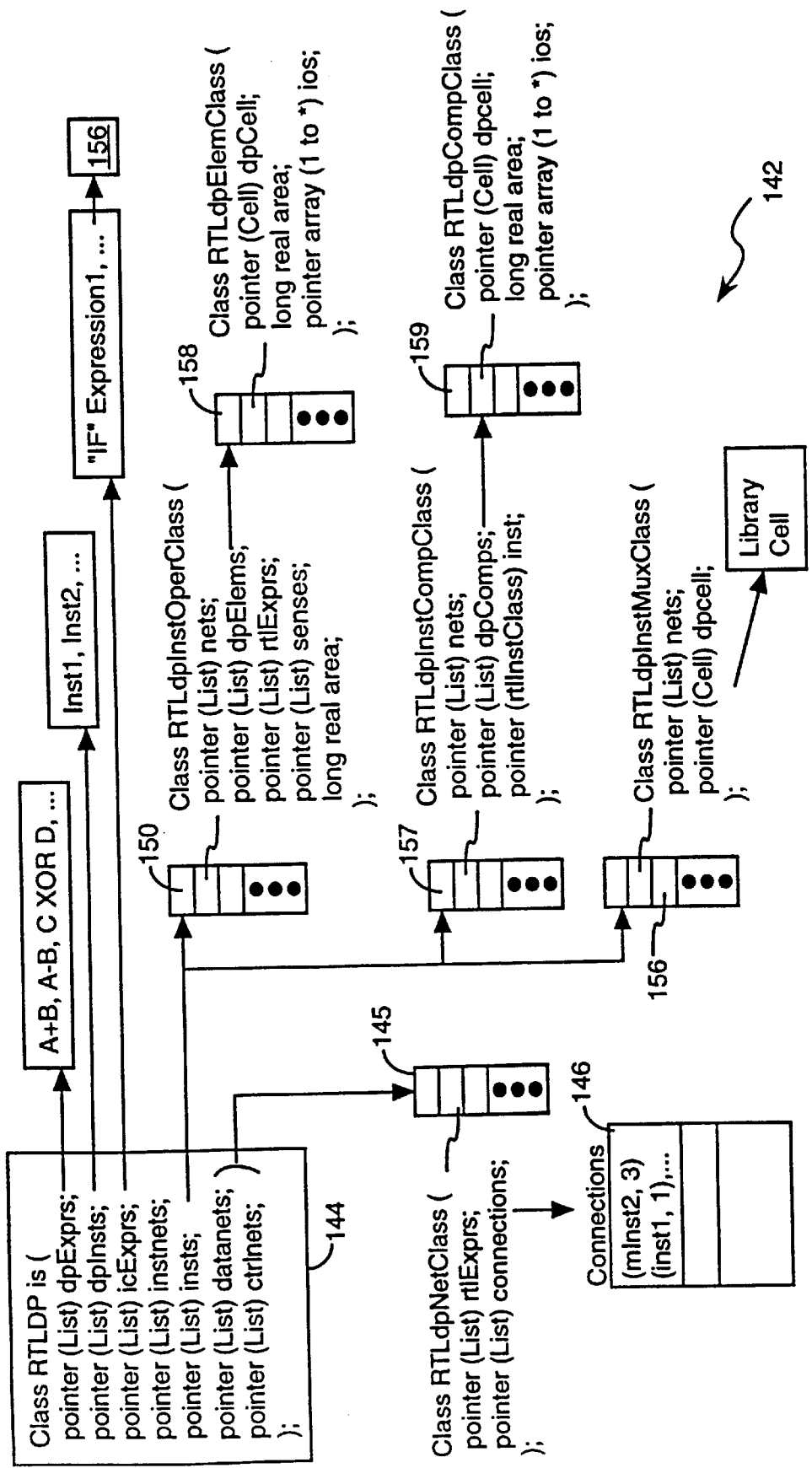
FIG. 13 depicts the relation between various data structures within the synthesized datapath structure of the invention.

Referring to FIG. 13, the header or directory 144 of the synthesized datapath structure 142, labelled RTLDP, is structured as follows:

```
class RTLDP (
    pointer (List) dpExprs;
    pointer (List) dpInsts;
    pointer (List) icExprs;
    pointer (List) instNets;
    pointer (List) insts;
    pointer (List) dataNets;
    pointer (List) ctrlNets;
);
```

The "dpExprs" in RTLDP 144 is a list of pointers to all the datapath expressions in the synthesized circuit, which means expressions such as A+B, A−B, C XOR D and so on. A data structure for each such expression is shown in FIG. 4 at 56. The "dpInsts" in RTLDP 144 is a list of pointers to all the instances of structural components used in the synthesized circuit.

The "icExprs" field is a list of inter-connect expressions implemented by the datapath. An "if" statement is an interconnect expression implemented by the datapath in the form of a multiplexer. The "insts" field is a list of entries that represent the various datapath instances that implement an expression from the field "dpExprs" or "icExprs" or an instance from the field "dpInsts". The data structures for these fields are described below.

The "instNets" field corresponds to the outputs of component instances in the "dpInsts" list. Using the example of FIG. 5, this field would list "Outp1" for the instance "Inst1" of the "Dff" component. The "dataNets" field contains a list of pointers to data structures RTLdpNetClass 145 and Connections 146 that store information representing all the interconnections between components of the synthesized datapath circuit, as will be described below.

The "ctrlNets" field stores a list of pointers to records in the net data structures 145, 146 that indicate the nodes to which the circuit's control signals are connected. Control signals determine what operation a datapath element performs. In the example of FIGS. 3 and 4, an addition or subtraction of "a" and "b" is performed depending upon the value of the "sel" signal, and thus the "sel" signal is a control signal.

The "insts" field in RTLDP 144 holds a list of pointers to datapath instances. Each datapath instances is represented by one of the following data structures: RTLdpInstOperClass 150 for datapath components that implement datapath expressions, RTLdpInstMuxClass 156 for multiplexers and RTLdpInstCompClass 157 for structural components.

To illustrate the nature of this synthesized datapath structure, the circuit elements of FIG. 3 and their corresponding DAGs in FIG. 5 will be used as an example. The field "dpExprs" defines a list of operator expressions that are implemented in the datapath. For the circuit of FIG. 3, the list of operator expressions is "A+B", "A−B", and "C XOR D". The field "dpInsts" is a list of component instances used in the datapath. In this example, only one component instance ("inst1" of a D flip-flop) is used. However, note that the instance mapper 130 may also identify multiple items for this list.

The rt1dpInstOperClass data structure corresponding to a possible entry in the "insts" field is defined as follows:

```
class rtlInstOperClass (
    pointer (List) nets;
    pointer (List) dpElems;
    pointer (List) rtlExprs;
    pointer (List) senses;
    long real area;
);
```

Each record 150 of type rt1dpInstOperClass references in its "dpElems" list, all of the datapath elements in the structured library that can implement the set of expressions listed in the "rt1Exprs" list. Before the optimization process, described below, the "rt1Exprs" list in each record 150 contains just one expression. For instance, the expression "A+B" would be in one record 150, and that record would contain a pointer list "dpElems" that lists all the cells in the library 74 that can perform that expression. When two or more expressions are merged during the circuit optimization process, the "rt1Exprs" list in the corresponding record 150 will contain a list of pointers to several expressions, and the "dpElems" list will be reduced in size so as to point only to library elements that can perform all of the expressions in the "rt1Exprs" list. The "senses" field of record 150 is used to determine mutual exclusiveness, and typically contains a logical expression, such as "ctrl3=1" that indicates the conditions under which the expressions in "rt1Exprs" need to be executed.

Each of the elements referenced in the "dpElems" list is a data structure 158 of type "rt1dpElemClass", defined as follows:

```
class rtlElemClass (
    pointer (Cell) dpcell;
    long real area;
    pointer array (1 to *) ios;
);
```

The field "dpcell" holds a pointer to a cell in the structured library 74. The field "area" holds the physical circuit layout area of the element, as well as any associated multiplexers added thereto during the circuit optimization process. The field "ios" holds a list of arrays. Each array holds the port mapping information about how this element implements the corresponding expression in the list "rt1Exprs" of the "rt1dpInstOperClass" structure 150.

The rt1dpInstCompClass data structure 157 corresponding to a possible entry in the "insts" field is defined as follows:

```
class rtldpInstCompClass (
    pointer (List) nets;
    pointer (List) dpComps;
    pointer (rtlInstClass) inst;
);
```

This structure references all the datapath elements that can implement an instance from the list "dpInsts" of the RTLDP structure 144. These elements are represented by "dpComps" list, where each item in the list is of a type "RTLdpCompClass", described below. The field "inst" is the instance in the RTL structure for which the datapath is being implemented.

Each record 159 of type RTLdpCompClass, corresponding to the "dpComps" field in 157 is defined as follows:

```
class rtldpCompClass (
    pointer (Cell) dpcell;
```

-continued

```
    long real area;
    pointer array (1 to *) ios;
);
```

The field "dpcell" holds a pointer to the corresponding library cell, "area" field holds the physical area of the element, and the field "ios" holds the port mapping about how this element implements the "inst" field of the RTLdpInstCompClass structure 157.

The records 156 in the RTLdpInstMuxClass data structure each correspond to a multiplexer entry in the "insts" field of RTLDP 144, and are defined as follows:

```
class rtldpInstMuxClass (
    pointer (List) nets;
    pointer (Cell) dpcell;
);
```

This structure refers to a multiplexer used to implement "IF" expressions in the "icExprs" field of RTLDP 144. The "dpcell" field points to a cell in the library 74 that defines the multiplexer. The "nets" list points to the RTLdpNetClass data structures 145 for defining all the connections to this multiplexer.

The RTLdpNetClass data structure records 145, corresponding to the "datanets" and "ctrlNets" fields of RTLDP 144, as well as to the "nets" fields in the RTLdpInstOperClass records 150, the RTLdpInstCompClass records 157, and the RTLdpInstMuxClass records 156, is defined as follows:

```
class rtldpNetClass (
    pointer (List) rtlExprs;
    pointer (List) connections
);
```

The entry "rt1Exprs" is the list of expressions that are connected to one net (i.e., one circuit node) and "connections" is the list of pointers to connection records 146. Each connection record 146 contains a list of all the component ports that are connected to one another. Each item in the component record is of the form "component identifier, port number". Thus a component record with the items "inst1,1", "minst2,3" indicated that port 1 of "inst1" is connected to port 3 of "minst2".

Figure 14:
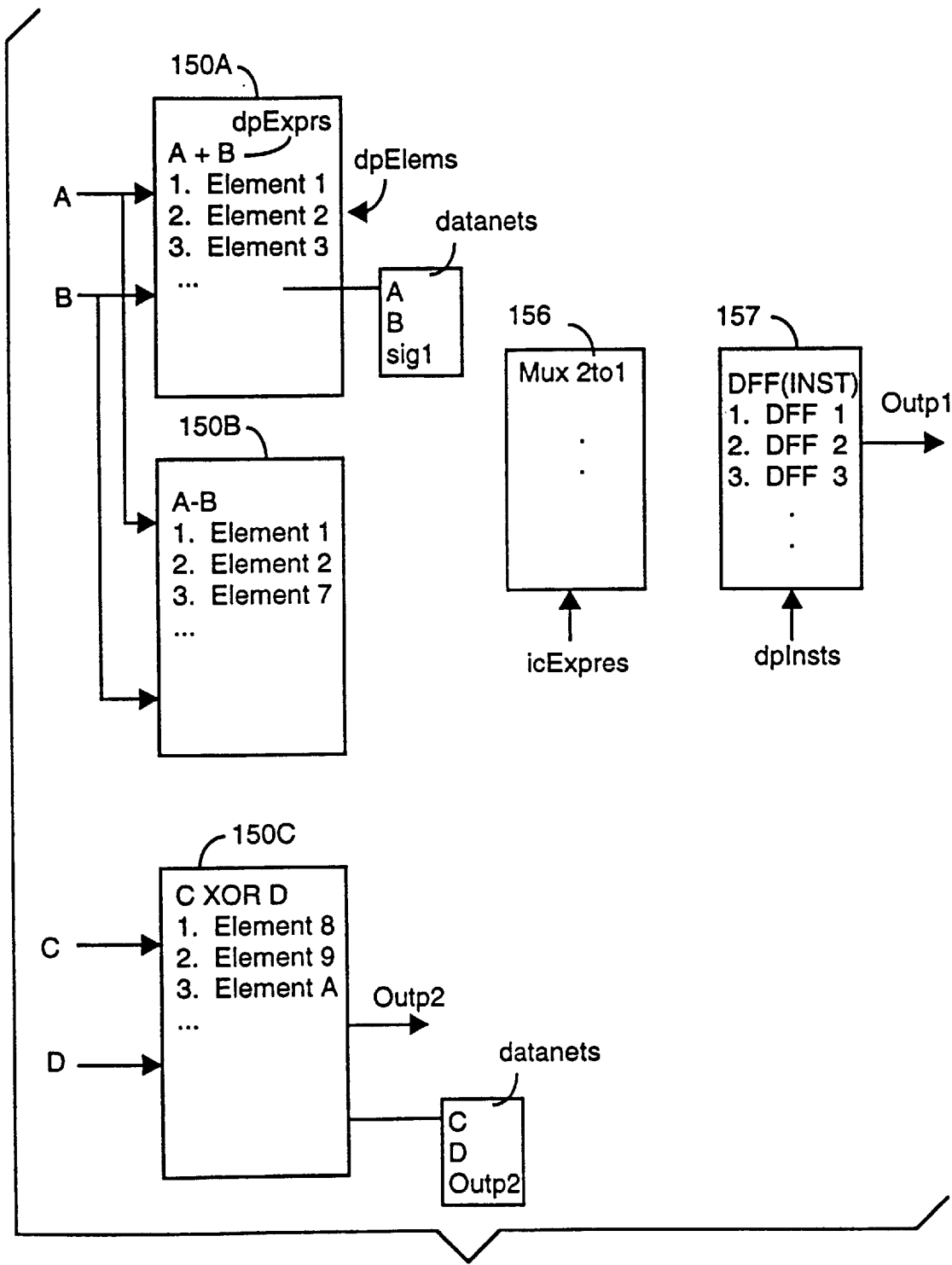
FIG. 14 illustrates some of the components that are stored in the synthesized datapath structure of the invention.

FIG. 14 is a conceptual representation of how the data structures in FIG. 13 are applied to the example associated with FIGS. 3 and 5. Block 150A contains a list of elements from the structured library 76 that perform the operation "A+B". This block is stored in the "insts" field of RTLDP. Analogously, blocks 150B and 150C respectively contain a list of elements from the structured library 76 that perform the operations "A–B" and "C XOR D". These blocks are also stored in the "insts" field of RTLDP. The operations "A+B", "A–B", and "C XOR D" are stored in the field "dpExprs". Block 156 is the multiplexer instance used to implement the "IF" expression within the datapath. This block is in the "insts" field of RTLDP. The "IF" expression is stored in the "icExpres" field. Block 157 is the instance of D-type Flip-FLop (DFF) used to implement the RTL description instance "Inst1". This block 157 is also pointed to by a pointer in the "insts" field of RTLDP.

DATAPATH OPTIMIZATION

Returning to FIG. 8, the datapath synthesizer 74 operates on the synthesized datapath structure 142 to select circuit elements from the synthesized datapath structure for physical implementation. Known techniques may be used to select elements based upon circuit area, speed, size, power consumption, or other factors. In addition to this processing, the present invention employs a datapath optimizer 78, as depicted in FIG. 1. The datapath optimizer 78 of the invention performs two critical operations.

Figure 15:
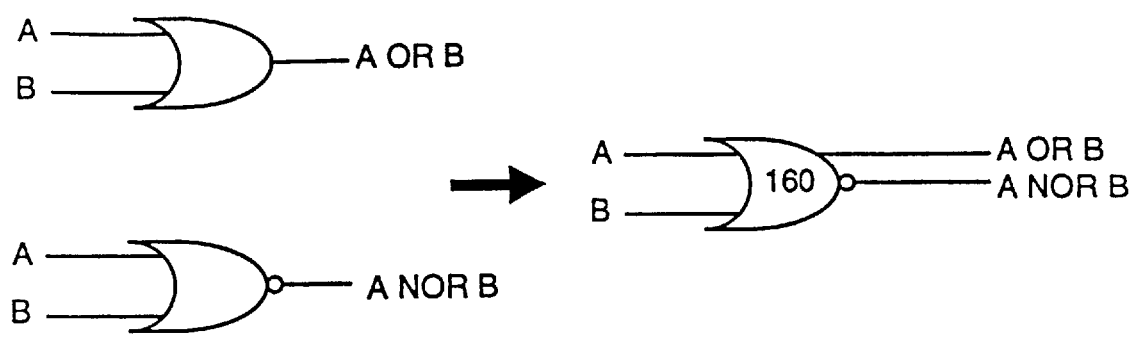
FIG. 15 illustrates the merging of two operations by using a two-output element from a structured library.

One operation associated with the datapath optimizer 78 is to merge elements with multiple outputs. By way of example, consider a library cell 160 that can implement the expression "A OR B" and the expression "A NOR B", as depicted in FIG. 15. The instances of these operations would be stored in the "dpInsts" field of the RTLDP data structure 142. The datapath optimizer 78 merges these two instances to generate a single element 160 that performs both operations. Analogous cases arise for other types of cells such as adders, subtractors, and multipliers. The datapath optimizer eliminates multiple elements when they can be combined into a single circuit element.

PARAMETERIZED HDL MODULES

Figure 16:
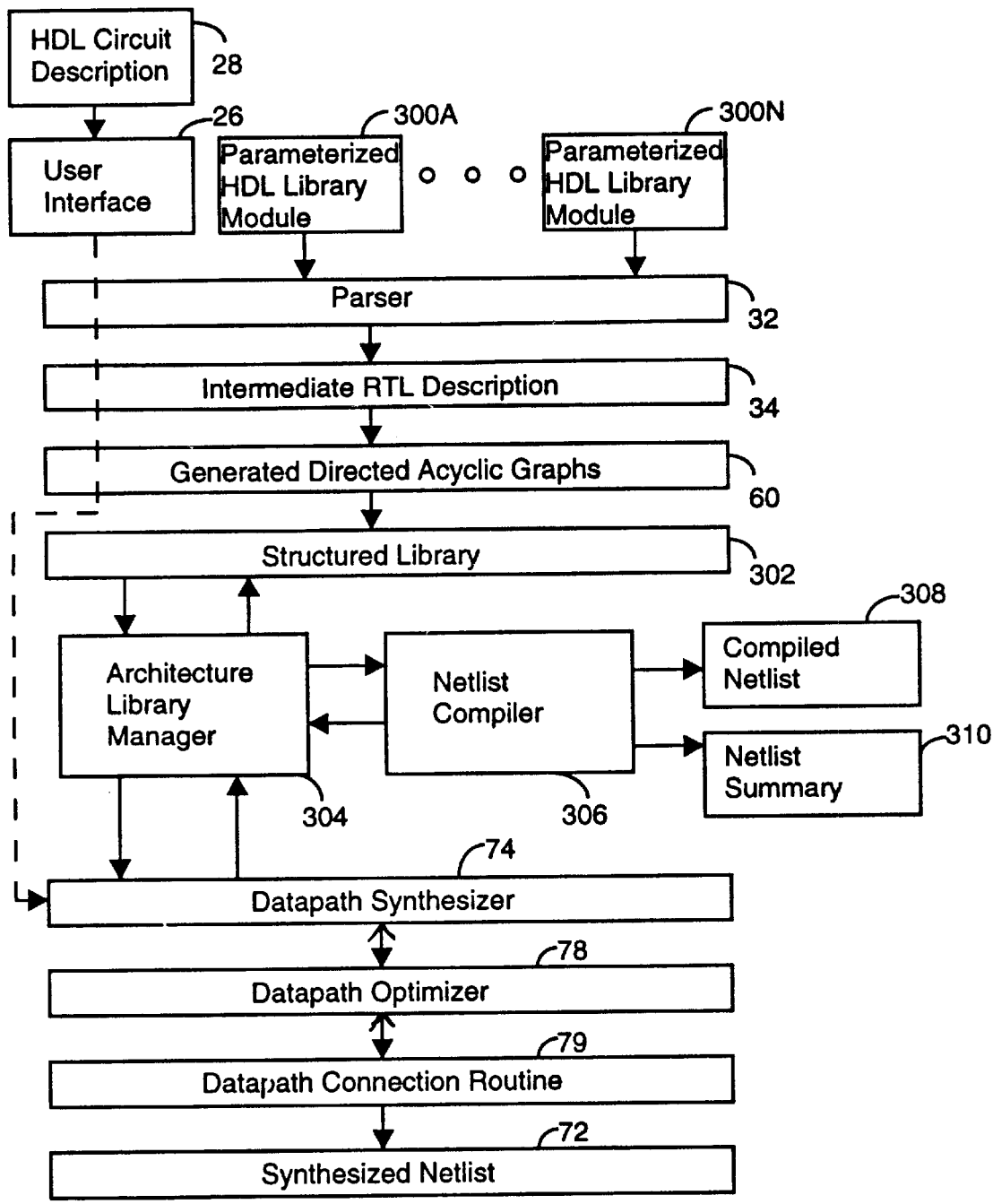
FIG. 16 illustrates the processing of parameterized HDL library modules in accordance with one embodiment of the invention.

FIG. 16 illustrates an alternate embodiment of the present invention. In this embodiment, parameterized HDL modules 300A–300N are used to form a structured library 302. Each parameterized HDL library module 300 includes a set of parameterized HDL modules. Each parameterized HDL module specifies, in an HDL language, the behavior and implementation of a library circuit element. For example, the behavior of an adder element is an add operation, such as Z <=A+B, where A and B are signal values at input ports A and B, and Z is an output port. Also, a parameter, say N, can model the variable width of the ports A, B and Z. In this case, an HDL description would specify the operation of the adder with a parameter for the variable width. Other examples of behavior include subtraction performed by a subtractor, addition and subtraction performed by an adder/subtractor, and multiplication performed by a multiplier. Other examples of parameters include the signed or unsigned properties of data signals, and the two width parameters of the two operands of a multiplier.

The previous embodiments described only the HDL behavior of a library circuit element. The implementation of the library circuit element was performed by calling a datapath compiler which uses a datapath library with a fixed number of library circuit elements. Also, each library circuit element is implemented by the datapath compiler in a proprietary way. Thus, a user cannot add customized library circuit elements in the datapath library and enable a datapath synthesizer to use instances of such customized library circuit elements in a synthesized netlist of a test circuit.

The parameterized HDL modules of this invention permit the creation of customized components by a user. In this embodiment, both the behavior and implementation of a library circuit element are described in HDL. Since writing HDL code is well known in the art, a user in accordance with the invention can easily create customized circuit elements such as a parameterized HDL module and place the HDL code in a parameterized library module 300. The user can also create a customized circuit element of fixed implementation, such as a 23 bit adder, which can be better than the HDL adder modules available in the existing HDL module libraries. As will be illustated below, the parameterized library HDL modules of this invention allow a designer to specify a parameterized circuit element and then provide an HDL implementation description that can be compiled to produce a circuit to perform the function described by the corresponding HDL behavior description. A datapath synthesizer in accordance with the invention can then use instances of these user customized library circuit elements in a synthesized netlist of a test circuit.

Thus, the present invention constitutes an extremely flexible tool. In addition, by relying upon HDL descriptions in the modules, the HDL descriptions can be synthesized using a synthesis tool, such as the ASIC Synthesizer from COMPASS Design Automation, Inc., San Jose Calif. The two HDL descriptions, namely, the HDL behavioral and the HDL implementation description of the modules, can be verified using a formal verification tool, such as the VFormal tool from COMPASS Design Automation, Inc., San Jose, Calif. Finally, the HDL modules can be simulated using an HDL simulator, such as the Leap Frog VHDL simulator from Cadence Design Systems, Inc., San Jose, Calif. Thus, parameterized HDL descriptions are distinct from prior art macro level modules (or datapath library elements) which rely upon ad hoc proprietary languages or methods. The ad hoc proprietary languages or methods used in the prior art do not constitute an IEEE standard or other industry standard. Moreover, these ad hoc structural descriptions or methods cannot be simulated, verified, and synthesized using standard HDL tools.

The flexibility of the disclosed invention permits a wide range of module libraries to be formed. For example, parameterized HDL modules may be combined to form a user defined HDL library module, an HDL commercial datapath library module, or an ASIC Synthesizer's pre-defined datapath library module. In addition, an XBLOX datapath library module can be formed. An XBLOX datapath library is a commercial library sold by Xilinx, Inc., San Jose, Calif.

Having provided an overview of the invention and its benefits, attention presently turns to an example of the invention so that its nature and benefits can be more fully appreciated. Each parameterized HDL module of the invention includes three parts: an entity description, a behavioral description, and an implementation description. The entity description specifies the parameters, input ports and output ports for a circuit element available in the HDL library. For example, a parameter can correspond to the bit width of the library circuit element. The behavioral description of the parameterized HDL module specifies the logical function performed by the library circuit element. The implementation description of the parameterized HDL module specifies how to construct a physical or netlist circuit element based on the parameter values. As will be illustrated below, the implementation description may be a structural HDL description or behavioral HDL description. In the case of a structural HDL description, the actual netlist structure of a macro-level circuit composed of primitive circuit components (such as logic-level gates) is specified. In the case of a behavioral HDL description, the datapath synthesizer synthesizes a macro-level circuit element. That is, behavioral statements are provided such that the datapath synthesizer may select circuit components to produce the specified behavior, as if implementing the circuit in random logic. The following code is an example of an entity description and a behavioral description using VHDL syntax.

```
1    library ieee, COMPASS_LIB;
2    use ieee.std_logic_1164.all;
3    use COMPASS_LIB.COMPASS.ALL;
4    entity MY_ASB is
5        generic (N: INTEGER :=4); --compass generic width 1
6        port (A, B: IN std_logic_vector(N-1 downto 0);
7             C_IN: IN std_logic;
8             ADD_SUB:IN std_logic;
9             RES:OUT std_logic_vector (N-1 downto 0));
10   end MY_ASB:
11   architecture BEHAVIOR of MY_ASB is begin
12       process (A, B, C_IN, ADD_SUB)
13       begin
14           if ADD_SUB = '1' then
15               RES<= A + B + C_IN);
16           else
17               RES<= A - B - not(C_IN);
18           end if;
19       end process;
20   end BEHAVIOR;
```

The entity description of lines 1–10 is generally consistent with the entity descriptions discussed earlier in the application, for instance in reference to the circuit element of FIG. 2. The major distinction between the previous entity descriptions and the entity description of the parameterized HDL module described herein is that a parameter is defined. That is, at line 5, a parameter "N" of the type INTEGER is defined. Note that in VHDL, the term "generic" denotes a parameter. The entity described at line 4, "MY_ASB", is an adder/subtractor component with a parameter "N" which models the variable width of the input and output ports "A", "B", and "RES", and the parameter "N" can be assigned any (positive) integer value. The statement ":=4" at line 5 indicates that the default value of "N" is 4. The statement "--compass generic width 1" is a special directive which indicates that the parameter "N" is a width (type 1) parameter. The datapath synthesizer uses this information during pattern matching and when compiling the implementation description. The ports "A", "B", and "RES" are "N" bits wide. That is, the width of these ports depends on the value of the parameter "N" during netlist compilation. The other ports "C_IN" and "ADD_SUB" are 1 bit wide.

The behavioral description of lines 11–20 is consistent with the previous behavioral descriptions provided in this application. The behavioral description models a high-level functional behavior of the adder/subtractor module, and is used by the datapath synthesizer for resource selection and resource sharing. Line 14 tests a condition, which, if satisfied, results in the adder/subtractor component performing an addition operation, as shown at line 15. If the condition is not satisfied, the adder/subtractor component performs a subtraction operation, as shown at line 17.

Lines 21–52 below constitute an implementation description of the MY_ASB component, which is used to structurally construct an N-bit adder/subtractor component described at lines 1–20.

```
21   architecture IMPLEMENTATION of MY_ASB is
22       component as02d1
23           port(A0, A1 : std_logic;
```

```
24              B0, B1: std_logic;
25              ADD0, ADD1 : std_logic;
26              CI : std_logic;
27              S0, S1 : out std_logic;
28              CO : out std_logic);
29    end component;
30    component as01d1
31        port (A, B: std_logic;
32              ADD : std_logic;
33              CI: std_logic;
34              S : out std_logic;
35              CO : out std_logic);
36    end component;
37    signal CARRY : STD_LOGIC_VECTOR((A'length/2-1) downto 0);
38  begin
39    G : for i in 0 to (A'length/2)-1 generate
40        g0: if i = 0 generate
41  u1 : as02d1 port map (A(0),A(1),B(0),B(1),ADD_SUB,ADD_SUB,C_IN,
42                RES(0),RES(1),CARRY(0));
43    end generate;
1     gn0: if i/ = 0 generate
2       u1:as02d1 port map(A(2*i),A(2*i+1),B(2*i),B2*i+1),ADD_SUB,ADD_SUB,
3         CARRY(i-1),RES(2*i),RES(2*i+1),CARRY(i));
4     end generate;
5   end generate;
6   g0dd: if (A'length MOD 2)/ = 0 generate
7     u1:as01d1 port map (A(A'left),B(B'left),ADD_SUB,CARRY(A'length/2-1),RES(A'left),open);
8   end generate;
9   end IMPLEMENTATION;
```

The implementation architecture description is a set of statements used to construct a circuit specified by the behavioral description. In this example, the implementation architecture specifies a ripple carry architecture which uses two primitive modules or cells from a gate library: a 2-bit adder/subtractor "as02d1" and a 1-bit adder/subtractor "as01d1". The p2-bit adder/subtractor "as02d1" is specified at line 22. Lines 23–28 describe the ports for this element. Line 23 specifies two one-bit inputs A0 and A1, while line 24 specifies the two one-bit inputs B0 and B1. Thus, there are a total of four data input lines. Whether an addition or subtraction operation is performed is specified by the signals ADD0 and ADD1. There is a carry input value "CI", specified at line 26. Line 27 specifies sum output values S0 and S1. Line 28 specifies a carry output value CO. The 1-bit adder/subtractor "as01d1" is specified at line 30. Lines 31–35 describe similar ports for this element. Line 37 defines a temporary signal "CARRY" that is used to store the carry value of the ripple carry adder.

Line 39 includes a loop statement from 0 to "(A'length/2)-1", where "A'length" means the width of the signal "A", which is equivalent to the generic parameter "N" as defined above. The "A'length" term is a standard syntax used in VHDL. Line 39 includes a "generate" statement which is used in VHDL to create a structure. The structure to be created begins with the zero bit, as indicated at line 40. That is, line 40 indicates that if "i" is zero, which it is on the first pass through the loop, then assign port values to the two bit adder cell as02d1, as specified at line 41. Recall that the ports of 02d1 were defined at lines 23–28, those values are now mapped at line 41 as follows: A0 to A(0), A1 to A(1), B0 to B(0), B1 to B(1), ADD0 to ADD_SUB, ADD1 To ADD_SUB, CI to C_IN, S0 to RES(0), S1 to RES(1), and CO to CARRY(0).

Lines 44–47 process a multiple bit embodiment of the adder/subtractor component. When the loop is first entered, i=1, thus at line 45 it can be seen that port values A(2), A(3), B(2), and B(3) are created. Similar values are assigned at line 46. Thereafter, "i" is incremented at line 39 and the processing of lines 45–30 46 continues until "i" equals "(A'length/2)–".

Line 50 is invoked when an odd bit adder is specified. That is line 49 tests for an odd bit adder with the statement "if (A'length MOD2)/=0 generate". This statement says, in effect, generate an extra bit if the remainder of N divided by two does not equal 0. For example, if N=5, then when divided by 2, a remainder of 1 exists and therefore an extra bit is required to complete the structure of the adder/subtractor component, which will be created at line 50. Line 50 specifies a one bit adder "as01d1". The port map for the adder refers to "A(A'left), B(B'left)". The "A'left" term in VHDL means the left bound value specified for the port. For example, at line 6 it is seen that the A and B ports have bit values from "N–1 downto 0". Thus, the terms "A(A'left), B(B'left)" are equivalent to "A(N–1), B(N–1)". Thus, the code at line 50 assigns the port values for the leftmost odd bit of the specified N-bit "my_asb" adder/subtractor architecture.

The foregoing example indicates that the invention's implementation architecture description can specify any synthesizable VHDL description. As a result, custom datapath libraries can be formed using the parameterized HDL modules of this invention.

The foregoing example specifies a structural implementation. That is, the implementation is specified as a netlist composed of two primitive cells, namely, the 2-bit adder/subtractor as02d1 and a 1-bit adder/subtractor as01d1. These primitive cells are available in various commercial standard cell and gate array libraries sold by COMPASS Design Automation, Inc., San Jose, Calif.

Instead of using the structural implementation description of the foregoing example, the parameterized HDL modules of the invention may use implementation which is purely behavioral. The following code illustrates a parameterized HDL module with an entity description, a behavioral description, and a behavioral implementation description.

```
60  library ieee, COMPASS_LIB;
61  use ieee.std_logic_1164.all;
62  use COMPASS_LIB.COMPASS.ALL;
63  entity MULT_ARRAY is
64    generic (N : POSITIVE :=4;--compass generic width1
65      M : POSITIVE :=4);--compass generic width2
66    port (A:IN std_logic_vector(N-1 downto 0);
67         B:IN std_logic_vector(M-1 downto 0);
68         RES: OUT std_logic_vector(N+M)-1 downto 0))
69  end MULT_ARRAY;
70  architecture BEHAVIOR of MULT_ARRAY is begin
71    process (A,B)
72    begin
73           RES <=A*B;
74    end process;
75  end BEHAVIOR;
76  architecture IMPLEMENTATION of MULT_ARRAY is begin
77    process (A,B)
78    variable RESULT,TEMP:std_logic_vector((N+M)-1 downto 0);
79    begin
80             RESULT :=(others=> '0');
81             for I in B'reverse_range loop
82                temp: =(others=> '0');
83                for j in (N+i)-1 downto i loop
84                       temp(j):=A(j-1) AND B(i);
85                end loop;
86                RESULT := RESULT + temp;
87             end loop;
88             RES <= RESULT;
89    end process;
90  end IMPLEMENTATION;
```

Lines 60–69 form an entity description of the type previously described.

Line 63 describes an array multiplication entity "MULT_ARRAY". Line 64 specifies a parameter "N" which is used to define the variable width of data bus or 5 port A. As before, the default value of 4 is specified. The statement "--compass generic width1" is a special directive which indicates that the parameter "N" is a width (type 1) parameter. Line 65 specifies a parameter "M" which is used to define the variable width of data bus or port B. Once again, a default value of 4 is used. The statement "--compass generic width2" is a special directive which indicates that the paremeter "M" is a width (type 2) parameter. The datapath synthesizer uses the two special width information during pattern matching and when compiling the implementation description. Thus, "N" and "M" are the two parameters of the parameterized HDL module for this example. The defined ports at lines 66 through 68 include an input port A (bus width is N), an input port B (bus width is M), and output port RES (bus width is N+M).

Lines 70–75 form the behavioral description of the parameterized HDL module. Line 73 indicates that the logical operation of the module is an N-bit by M-bit multiplication operation of input signals "A" and "B".

Lines 76–79 form the behavioral implementation description of the parameterized HDL module. Unlike the previous example of a structural implementation where specific primitive cells (as02d1 and as01d1) from a vendor-specific gate library were used to construct a netlist, this behavior implementation does not rely upon specific primitive cells or circuit modules. Thus, the behavioral implementation description is technology independent. The behavioral implementation description is synthesized by a datapath synthesizer to implement a circuit which executes the behavior. Thus, for different gate libraries (standard cell library, gate array library or FPGA library) the synthesized netlist will be different. Behavioral descriptions have been used in HDL circuit descriptions. However, the previous uses of behavioral descriptions have been for the purpose synthesizing a circuit to implement specified behavior. The use of a behavioral description to specify circuit elements in a library accessed by a datapath synthesizer is believed to be novel.

Line 78 defines a variable "RESULT", at line 80 the variable is initialized to zero. Line 81 begins a loop which ends at line 87. The statement at line 81 causes a loop to be performed for values 0 to "M−1", where M is the value associated with the bit width of the "B" input signal (see line 67). The statement "for I in B'reverse_range loop" is a standard VHDL language construct to achieve this operation. A loop is also defined between lines 83 and 85. Line 84 performs a 1-bit logical AND operation between the (j−1)th bit of A, "(j−1)", and the i-th bit of B, "B(i)", and stores the 1-bit value in the j-th bit of temp, "temp(j)", depending on the values of loop variables "i" and "j". At line 86 the temp value from the bit level logical AND operation is added to the RESULT variable and the processing returns to line 81.

Different parameterized HDL modules have now been described. It will be appreciated that sets of such modules can be combined to form parameterized HDL library modules, as shown in FIG. 16. FIGS. 16 shows parameterized HDL library modules 300A through 300N. By way of example, the parameterized HDL library modules may include a user defined HDL library module, an HDL ASIC synthesizer's pre-defined datapath library module, a commercial datapath library module, and an XBLOX datapath library module. A user defined HDL library module includes parameterized HDL modules defined by a circuit designer or a library developer. Thus, customized circuit components can be used from such a library by a datapath synthesizer. Note that each customized circuit component is specified in HDL by an entity description, a behavioral description, and an implementation description. A similar format is used for the HDL ASIC synthesizer's pre-defined datapath library module. The commercial datapath library includes components of a commercial datapath library, where the components are described in HDL using the entity description and behavioral description. A commercial datapath compiler and Xilinx XBLOX tool have proprietary information of implementing each datapath component, and the final implementation is not known to a datapath synthesizer. In this case, the datapath synthesizer creates a parameterized datapath specification netlist using the previous embodiment of this invention which is then compiled by a commercial datapath compiler or XBLOX tool, as appropriate.

As shown in FIG. 16, the processing of the parameterized HDL library modules is consistent with previously described operations in this application. Namely, the elements of each library are parsed with a parser 32 into an intermediate RTL description 34. Directed acyclic graphs 60 are then generated from the intermediate RTL description 34. The directed acyclic graphs 60 are then stored in a structured library 302 which can be accessed by the datapath synthesizer to find matches for implementing an HDL circuit description 28.

The datapath synthesizer 74 accesses the structured library 302 through an architecture library manager 304. The architecture library manager 304 accesses specified parameterized HDL library modules 300 to identify circuit components that can be used to implement the HDL circuit description 28. For example, the user may specify that only circuit elements from a specific parameterized HDL library module should be used to implement the HDL circuit description 28. This can be achieved by user interface commands and/or synthesis directives in the HDL circuit description 28. In this case, the components from the remaining parameterized HDL library modules would be ignored. In another example, which is described later, the user may want to implement the HDL circuit description 28 using components from multiple parameterized HDL library modules. In this case, the datapath synthesizer would use components from multiple parameterized HDL library modules.

As previously described, the datapath synthesizer 74 attempts to match functional operations specified in an HDL circuit description 28 with functional operations available in the structured library 302. As indicated above, this matching operation is preferably performed by matching directed acyclic graphs of the HDL circuit description 28 with directed acyclic graphs of the structured library 302. If the datapath synthesizer 74 identifies a functional behavior in a parameterized HDL module that can be used to implement a portion of the HDL circuit description 28, then the netlist compiler 306 is used to form a specific instance of the parameterized HDL module (where all the parameters are assigned the appropriate values). In other words, a netlist for a specific implementation of the parameterized HDL module is compiled by the netlist compiler 306. For example, if the datapath synthesizer 74 ascertains that a 17-bit implementation of the adder/subtractor component "my_asb" (see computer code lines 1–52 above) can be advantageously used to implement a portion of a given HDL circuit description 28, then the parameter "N" is assigned by the integer value "17" and the computer code associated with "my_asb" is compiled to form a netlist 308.

The compiled netlist 308 describes the circuit components and the connections used to implement the 17-bit adder/subtractor. As will be discussed below, the compiled netlist 308 may be combined with other netlist components to form a synthesized netlist which implements the HDL circuit description 28.

The netlist compiler 306 is shown as a separate component for clarity, but in practice it will usually be implemented as a portion of the datapath synthesizer 74, such as the Compass ASIC Synthesizer sold by COMPASS Design Automation, Inc., San Jose, Calif. Using a datapath synthesizer 74 to form a compiled netlist from an HDL description is a technique known in the art. The HDL descriptions of the present invention are novel because they allow the use of parameterized HDL implementation descriptions of library circuit elements to construct circuits based on the values of the parameters.

The contents of the netlist are preferably provided in a netlist summary 310. Table I illustrates an example of a netlist summary for a 17-bit implementation of "my_asb" (computer code line 4).

TABLE I

| Cell Name | Num Insts | Gate Eqv Per Cell | Tot Gate Equivs | Width Per Cell | Total Width |
|---|---|---|---|---|---|
| AS01D1 | 1 | 10.0 | 10.0 | 60.8 | 60.8 |
| AS02D1 | 8 | 20.0 | 160.0 | 121.6 | 972.8 |
| Totals: | 9 | | 170.0 | | 1033.6 |

The netlist compiler 306, relying upon the implementation behavior (computer code lines 21–52 above), forms a 17-bit adder/subtractor instance of the component "my_asb". The component uses 1 one-bit adder/subtractor (as01d1) and 8 two-bit adder/subtractor (as02d1) cells. As indicated in Table I, this results in 9 instances of gate-level components from a standard cell library sold by COMPASS Design Automation, Inc., San Jose, Calif. The "Gate Equivalent Per Cell" specifies a relative size of a cell in a standard cell library based on the number of transistors in that cell. The term "Gate Equivalent" is well known in the art, and is used to compare relative sizes of compiled or synthesized netlists. For the given standard cell library, the size of a one-bit adder/subtractor as01d1 is 10 gate equivalent, and the size of a two-bit adder/subtractor as02d1 is 20 gate equivalent. Thus, the total number of gate equivalent for the 17-bit adder/subtractor netlist is 170. Table I also indicates that the total width of the resultant netlist is 1033.6 units (units are often defined in microns or lambdas).

Table II illustrates a summary for a 16-bit by 18-bit implementation of the multiplier array "mult_array" (computer code line 63).

TABLE II

| Cell Name | Num Insts | Gate Eqv Per Cell | Tot Gate Equivs | Width Per Cell | Total Width |
|---|---|---|---|---|---|
| ad01d1 | 184 | 7.5 | 1380.0 | 48.0 | 8832.0 |
| ad02d1 | 41 | 15.0 | 615.0 | 96.0 | 3936.0 |
| in01d0 | 319 | .5 | 159.5 | 6.4 | 2041.6 |
| nd02d0 | 509 | 1.0 | 509.0 | 9.6 | 4886.4 |
| nd03d0 | 18 | 1.5 | 27.0 | 12.8 | 230.4 |
| nd04d0 | 1 | 2.0 | 2.0 | 16.0 | 16.0 |
| Totals: | 1072 | | 2692.5 | | 19942.4 |

The netlist compiler 306, relying upon the implementation behavior (computer code lines 76–90 above), forms the array multiplier using adder cells as ad01d1 and ad02d1, an inverter cell in01d0, and NAND gates nd02d0, nd03d0, and nd04d0. As indicated in Table II, the compiled netlist has 1072 instances of cells from a standard cell library. The total gate equivalent value for this compiled netlist is 2692.5. Table II also indicates that the total width of the resultant circuit is 19,942.4 units.

Returning now to FIG. 16, it can be appreciated that the architecture library manager 304 coordinates the construction of a specific implementation of the parameterized HDL modules obtained from the parameterized HDL library modules 300, by assigning parameters their appropriate values. A netlist is compiled for each specific implementation of a parameterized HDL module. The compiled netlist can be combined with other netlist elements to form a complete netlist implementing the behavior of the HDL circuit description 28. For example, the following code is an example of a VHDL circuit description 28.

```
100   library ieee, COMPASS_LIB;
101   use ieee.std_logic_1164.all;
  1   use COMPASS_LIB.COMPASS.ALL;
  2   entity alu1 is
  3     port (A, B:IN std_logic_vector (3 downto 0);
  4         SO: OUT std_logic_vector (3 downto 0);
  5         CIN:IN std_logic;
```

-continued

```
6           OPCODE.:IN std_logic_vector (4 downto 0)
            );
108    end alu1;
109    architecture alu1 of alu1 is begin
110         process (A, B, CIN, OPCODE)
111         begin
112            case OPCODE is
113               when "00000"|"00001" =>     SO<=A + B + CIN;
114               when "00010"|"00011" =>     SO<=A - B - not(CIN);
115               when "01000"|"01011"|"10001"|"10010"|"11000"|"11011"=>
116                              SO<=A xor B;
117               when "01001"|"01010"|"10000"|"10011"|"11001"|"11010"=>
118                              SO<= xnor (A, B);
119               when "01100"|"11100" =>     SO <= A nand B;
120               when "01111"|"11111" =>     SO <= A or B;
121               when "10100" => SO <= A and B;
122               when "10111" => SO <= A nor B;
123               when others  => SO <= "XXXX";
124            end case;
125         end process;
126    end alu1;
```

The foregoing circuit description 28 is for an arithmetic logic unit (ALU). The ports for the entity are described at lines 104–107. The operation to be performed by the ALU is specified by the OPCODE. A conversion table for these operations is provided at lines 113–123. For example, line 113 specifies that when the OPCODE value is "00000" or "00001", the ALU performs the A+B+CIN operation and the value is available at the output port SO.

The processing of the HDL circuit description 28 is consistent with previous explanations provided in this application. That is, the circuit description 28 is parsed by parser 32 to form an intermediate RTL description 34. Directed acyclic graphs are then generated from the intermediate RTL description 34. The datapath synthesizer 74 then matches the directed acyclic graphs of the HDL circuit 28 with directed acyclic graphs of the structured library 302. When a match is found, the element from the structured library is used to construct a circuit performing the operations associated with the HDL circuit description 28. If the datapath synthesizer 74 finds a match to a parameterized HDL module, then parameter values are computed and assigned to a data structure for possible compilation of that module. Note that an HDL operation of the circuit can be matched with several parameterized HDL modules, and only one parameterized HDL module is selected by the datapath synthesizer 74 to generate a compiled netlist using the netlist compiler 306. The datapath optimizer 78 performs datapath optimization, such as merging elements with multiple outputs, as described before. The datapath connection routine 79 connects the various datapath components to form the synthesized netlist 72. That is, netlists generated from parameterized HDL modules are combined with netlists created from nonparameterized HDL modules to form a synthesized netlist 72. Table III is an example of a synthesized netlist report for the example ALU HDL circuit description 28.

TABLE III

```
150   Hierarchy of netlist "alu1_p"
151   alu1_p
152         alu1_my_asb_4_p_1
153         alu1_dpl_p
154              | alu1_dp1_p_dpand0021_1
155              | alu1_dp1_p_dpmux7071_1
156              | alu1_dp1_p_dpora0021_1
157              | alu1_dp1_p_dpxor0021_1
158         DATAPATH NAME: alu1_dp1     DATAPATH WIDTH: 4
                              Num
159   Cell Name              Insts 160   DPAND0021        1
161   DPMUX7071        1
162   DPORA0021        1
163   DPXOR0021        1
164                          Num       Gate Eqv     Tot Gate     Width
      Cell Name              Insts     Per Cell     Equivs       Per Cell     Total Width 165   alu1_my_asb_4_p_1       1         40.0         40.0         243.2         243.2
166   alu1_dp1_p              1        131.0        131.0         982.4         982.4
167   in01d0                 29           .5         14.5           6.4         185.6
168   nd02d0                 29          1.0         29.0           9.6         278.4
169   nd03d0                 15          1.5         22.5          12.8         192.0
170   nd04d0                  4          2.0          8.0          16.0          64.0

171   Totals:                79                     245.0                      1945.6
```

Line 151 indicates that the netlist is identified as "alu1_p". Lines 152 and 153 indicate that the netlist "alu1_p" includes a netlist "alu1_my_asb_4_p1" and a netlist "alu1_dp1_p". The netlist "alu1 my asb_4_p_1" corresponds to a 4-bit embodiment of the parameterized HDL module "my_asb" described at computer code lines 1–52. The netlist "alu1_dp1_p" is compiled using a commercial datapath compiler which also performs the functions of a netlist compiler. The netlist "alu1_dp1_p" is composed of netlists "alu1_dp1_p_dpand0021_ 1, alu1_dp1_p_ dpmux7071P1, alu1_dp1_p_dpora0021_1, and alu1_ dp1_p_dpxor00211. Each of these netlists contains several primitive cells from the given standard cell library. Lines 160–163 indicate that there is one instance of each of the foregoing netlists.

Lines 164–171 provide a summary of the netlist created. Line 165 indicates that there is one instance of the compiled netlist "alu1_my asb_4_p 1". This netlist is a 40 gate equivalent structure with a width of 243.2 units. Line 166 indicates that there is one instance of the netlist "alu1_ dp1_p". This netlist size is 131 gate equivalent and its width is 982.4 units. The remaining entries in the table are part of the netlist synthesized using traditional HDL synthesis techniques. This part of the netlist corresponds to the control logic that controls the ALU, which does not form a portion of the datapath. The element "in01d0"is an inverter, "nd02d0" is a 2-input NAND gate, "nd03d0" is a 3-input NAND gate, and "nd04d0" is a 4-input NAND gate. Line 171 provides the total number of instances, the total gate equivalent value, and the total width of the synthesized datapath and its associated control circuitry.

The parameterized HDL modules of the invention may be implemented in a number of ways. FIG. 4 illustrates an RTL structure 34. The RTL description record 40 has a pointer 44 directed toward an RTL net data structure 46. The RTL net data structure 46 has pointers "Leftptr" and "Rightptr" that point to RTL Expression specifications 56. The "Leftptr" and "Rightptr" specify the left and right bounds of the RTL net data structure 46. The "Args" field may contain a list of pointers to RTL net data structures 46, RTL Parameter data structures 55, RTL Expression specifications 56, and constant values, which are used to form an RTL expression. For example, the expression for the "Leftptr" of port "A" of "my_asb" component (see computer code, line 6) is "N–1", where "N" is a parameter (see computer code, line 5), while the expression for the "Rightptr" of port "A" of "my_asb" component (see computer code, line 6) is "0". During pattern matching, the datapath synthesizer computes the parameter values for each instance of a parameterized HDL module and stores the parameter values in the parameter table 92 of FIG. 7. The netlist compiler uses the stored parameter values for compiling a specific implementation of the parameterized HDL module. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method of synthesizing a circuit netlist from a Hardware Description Language (HDL) circuit description, said method executed by a computer under the control of a program, said computer including a memory for storing said program, said method comprising the steps of:

receiving in said computer said HDL circuit description;

storing parameterized HDL modules in said memory each parameterized HDL module including a behavioral operation specified in HDL and an implementation operation specified HDL, each of said parameterized HDL modules specifying a logical operation;

matching with directed acyclic graphs, a selected logical operation of said HDL circuit description with a selected parameterized HDL module of said parameterized HDL modules which performs said selected logical operation; and assigning parameter values to said selected parameterized HDL module to form a specific implementation of said selected parameterized HDL module that can be used to implement said HDL circuit description into a corresponding circuit netlist.

2. The method of claim 1 further comprising the step of compiling said specific implementation of said selected parameterized HDL module to form a compiled netlist.

3. The method of claim 2 further comprising the step of combining said compiled netlist with synthesized netlists to form a top-level netlist.

4. The method of claim 3 further comprising the step of synthesizing and optimizing said top-level netlist to form a synthesized netlist.

5. The method of claim 1 wherein said storing step includes the step of storing parameterized HDL modules with a parameter specifying a bit width for input and output ports.

6. The method of claim 1 wherein said storing step includes the step of storing parameterized HDL modules to form a user defined HDL library module.

7. The method of claim 1 wherein said storing step includes the step of storing parameterized HDL modules to form an HDL commercial datapath library module.

8. The method of claim 1 wherein said storing step includes the step of storing parameterized HDL modules to form an HDL ASIC synthesizer predefined library module.

9. The method of claim 1 wherein said storing step includes the step of storing parameterized HDL modules, wherein each parameterized HDL module fiber includes an entity description specified in HDL.

10. The method of claim 9 wherein said entity description includes variable bit width input ports and output ports.

11. The method of claim 9 wherein said behavioral description includes a behavioral specification of the function to be performed by each parameterized HDL module.

12. The method of claim 9 wherein said implementation description includes a structural description specifying specific components to be used in constructing said specific implementation of said selected parameterized HDL module.

13. The method of claim 9 wherein said implementation description includes a behavioral description specifying a behavior to be synthesized by a datapath synthesizer to implement said specific implementation of said selected parameterized HDL module.

14. A computer readable memory to direct a computer to function in a specified manner, comprising:

cell data stored in said memory, said cell data including:

a set of cells constituting a Hardware Description Language (HDL) circuit description, a set of parameterized HDL modules, wherein each parameterized HDL module includes a behavioral operation specified in HDL and an implementation operation specified in HDL; and executable instructions stored in said memory to synthesize a circuit netlist from said HDL circuit description, said executable instructions including:

instructions to match, with directed acyclic graphics, elements of said HDL circuit description with said parameterized HDL modules and to assign parameter values for said parameterized HDL modules to form specified parameter HDL modules that can be used to implement said HDL circuit description into a corresponding circuit netlist.

15. The computer readable memory of claim 14 further comprising executable instructions to compile said specified parameter HDL modules to form compiled netlists.

16. The computer readable memory of claim 15 further comprising executable instructions to combine said compiled netlists with synthesized netlists stored in said memory to form a top-level netlist.

17. The computer readable memory of claim 14 wherein each parameterized HDL module further includes an entity description specified in HDL.

18. The computer readable memory of claim 17 wherein said entity description includes variable width input ports and output ports.

19. The computer readable memory of claim 17 wherein said implementation description includes a structural description specifying specific components to be used in constructing said specified parameter HDL modules.

* * * * *